(12) United States Patent
Pyeon et al.

(10) Patent No.: US 7,818,464 B2
(45) Date of Patent: Oct. 19, 2010

(54) APPARATUS AND METHOD FOR CAPTURING SERIAL INPUT DATA

(75) Inventors: Hong Beom Pyeon, Kanata (CA); HakJune Oh, Kanata (CA)

(73) Assignee: Mosaid Technologies Incorporated, Ottawa, Ontario (CA)

(*) Notice: Subject to any disclaimer, the term of this patent is extended or adjusted under 35 U.S.C. 154(b) by 605 days.

(21) Appl. No.: 11/567,551

(22) Filed: Dec. 6, 2006

(65) Prior Publication Data

US 2008/0137467 A1 Jun. 12, 2008

(51) Int. Cl.
*G06F 3/00* (2006.01)
*G06F 13/00* (2006.01)
*G11C 8/10* (2006.01)

(52) U.S. Cl. ............... 710/5; 710/7; 710/110; 365/230.06

(58) Field of Classification Search ........ 710/5
See application file for complete search history.

(56) References Cited

U.S. PATENT DOCUMENTS

| | | | |
|---|---|---|---|
| 4,174,536 A | 11/1979 | Misunas et al. |
| 4,733,376 A | 3/1988 | Ogawa |
| 4,796,231 A | 1/1989 | Pinkham |
| 4,816,996 A | 3/1989 | Hill et al. |
| 4,899,316 A | 2/1990 | Nagami |
| 5,038,299 A | 8/1991 | Maeda |
| 5,126,808 A | 6/1992 | Montalvo et al. |
| 5,136,292 A | 8/1992 | Ishida |
| 5,168,556 A | 12/1992 | Lajtai et al. |
| 5,175,819 A | 12/1992 | Le Ngoc et al. |
| 5,243,703 A | 9/1993 | Farmwald et al. |
| 5,280,539 A | 1/1994 | Yeom et al. |
| 5,365,484 A | 11/1994 | Cleveland et al. |
| 5,404,460 A | 4/1995 | Thomsen et al. |

(Continued)

FOREIGN PATENT DOCUMENTS

WO 0169411 A2 9/2001

(Continued)

OTHER PUBLICATIONS

International Search Report of PCT/CA2007/002183 dated Apr. 7, 2008.

(Continued)

*Primary Examiner*—Alford W Kindred
*Assistant Examiner*—Brooke J Dews
(74) *Attorney, Agent, or Firm*—Shin Hung; Borden Ladner Gervais LLP

(57) ABSTRACT

A serial input processing apparatus provides how to capture serial data without loss of a single bit while command interpretation is being performed in a command decoder at high frequency. Individual bytes of serial bits of a pre-defined sequence are latched and bit streams are temporarily stored with multiple clocks. The temporary store is conducted before transferring byte information to assigned address registers to register the address. The address registration and the data registration are performed by latching all bit streams of the serial input at the leading edges of clocks. While at a high frequency operation (e.g., 1 GHz or 1 ns cycle time), no additional registers are required for storing bit data during command interpretation with enough time margins between the command bit stream interpretation and next bit data stream.

7 Claims, 23 Drawing Sheets

U.S. PATENT DOCUMENTS

| | | | |
|---|---|---|---|
| 5,440,694 A | 8/1995 | Nakajima | |
| 5,452,259 A | 9/1995 | McLaury | |
| 5,473,563 A | 12/1995 | Suh et al. | |
| 5,473,577 A | 12/1995 | Miyake et al. | |
| 5,596,724 A | 1/1997 | Mullins et al. | |
| 5,602,780 A | 2/1997 | Diem et al. | |
| 5,636,342 A | 6/1997 | Jeffries | |
| 5,671,178 A | 9/1997 | Park et al. | |
| 5,721,840 A | 2/1998 | Soga | |
| 5,740,379 A | 4/1998 | Hartwig | |
| 5,761,146 A | 6/1998 | Yoo et al. | |
| 5,771,199 A | 6/1998 | Lee | |
| 5,802,006 A | 9/1998 | Ohta | |
| 5,818,785 A | 10/1998 | Ohshima | |
| 5,828,899 A | 10/1998 | Richard et al. | |
| 5,835,935 A | 11/1998 | Estakhri et al. | |
| 5,859,809 A | 1/1999 | Kim | |
| 5,872,994 A | 2/1999 | Akiyama et al. | |
| 5,937,425 A | 8/1999 | Ban | |
| 5,941,974 A | 8/1999 | Babin | |
| 5,959,930 A | 9/1999 | Sakurai | |
| 5,995,417 A | 11/1999 | Chen et al. | |
| 6,002,638 A | 12/1999 | John | |
| 6,085,290 A | 7/2000 | Smith et al. | |
| 6,091,660 A | 7/2000 | Sasaki et al. | |
| 6,107,658 A | 8/2000 | Itoh et al. | |
| 6,128,703 A * | 10/2000 | Bourekas et al. | 711/138 |
| 6,144,576 A | 11/2000 | Leddige et al. | |
| 6,148,364 A | 11/2000 | Srinivasan et al. | |
| 6,178,135 B1 | 1/2001 | Kang | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,438,064 B2 | 8/2002 | Ooishi | |
| 6,442,098 B1 | 8/2002 | Kengeri | |
| 6,535,948 B1 | 3/2003 | Wheeler et al. | |
| 6,584,303 B1 | 6/2003 | Kingswood et al. | |
| 6,594,183 B1 | 7/2003 | Lofgren et al. | |
| 6,601,199 B1 | 7/2003 | Fukuda et al. | |
| 6,611,466 B2 | 8/2003 | Lee et al. | |
| 6,658,582 B1 | 12/2003 | Han | |
| 6,680,904 B1 | 1/2004 | Kaplan et al. | |
| 6,715,044 B2 | 3/2004 | Lofgren et al. | |
| 6,732,221 B2 | 5/2004 | Ban | |
| 6,754,807 B1 | 6/2004 | Parthasarathy et al. | |
| 6,763,426 B1 | 7/2004 | James et al. | |
| 6,769,039 B2 | 7/2004 | Shiraishi | |
| 6,807,103 B2 | 10/2004 | Cavaleri et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,853,573 B2 | 2/2005 | Kim et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,967,874 B2 | 11/2005 | Hosono | |
| 6,996,644 B2 | 2/2006 | Schoch et al. | |
| 7,073,022 B2 | 7/2006 | El-Batal et al. | |
| 7,161,842 B2 | 1/2007 | Park | |
| 7,539,909 B2 * | 5/2009 | LeClerg et al. | 714/718 |
| 2002/0087708 A1 | 7/2002 | Low et al. | |
| 2003/0074505 A1* | 4/2003 | Andreas et al. | 710/110 |
| 2004/0001380 A1 | 1/2004 | Becca et al. | |
| 2004/0019736 A1 | 1/2004 | Kim et al. | |
| 2004/0024960 A1 | 2/2004 | King et al. | |
| 2004/0039854 A1 | 2/2004 | Estakhri et al. | |
| 2004/0148482 A1* | 7/2004 | Grundy et al. | 711/167 |
| 2004/0199721 A1 | 10/2004 | Chen | |
| 2004/0230738 A1 | 11/2004 | Lim et al. | |
| 2004/0256638 A1 | 12/2004 | Perego et al. | |
| 2005/0120163 A1 | 6/2005 | Chou et al. | |
| 2005/0160218 A1 | 7/2005 | See et al. | |
| 2005/0166006 A1* | 7/2005 | Talbot et al. | 711/105 |
| 2005/0213421 A1 | 9/2005 | Polizzi et al. | |
| 2006/0031593 A1 | 2/2006 | Sinclair | |
| 2007/0041255 A1* | 2/2007 | Jeddeloh | 365/201 |

FOREIGN PATENT DOCUMENTS

WO          WO 0209405 A2          1/2002

OTHER PUBLICATIONS

"Toshiba MOS Digital Integrated Circuit Silicon Gate CMOS", TH58NVG1S3AFT05, Toshiba Corporation, May 19, 2003 pp. 1-32.

"Intel® Advanced+ Boot Black Memory Flash (C3)", May 2005, Intel Corporation, pp. 1-72.

"256 M×8 Bit/ 128m×16 Bit/ 512M×8 Bit NAND Flash Memory" K9K4G08U1M, K9F2G08U0m, K9F2G16U0m, Rev. 1.0, Samsung Electronics Co., Ltd., May 6, 2005, pp. 1-41.

King, et al.,"Communicating with Daisy Chained MCP42XXX Digital Potentiometers", Microchip AN747, pp. 1-8, 2001.

"High Speed Small Sectored SPI Flash Memory," Atmel Corp., pp. 1-22 (2006).

64 Megabit CMOS 3.0 Volt Flash Memory with 50 MHz SPI, Spansion, 2006, pp. 1-22.

"DiskOnChip H1 4Gb (512MByte) and 8 Gb (1 Gbyte) High Capacity Flash Disk with NAND and x2 Technology," Data Sheet, Rev. 0.5 (preliminary), M-Systems Flash Disk Pioneers Ltd., pp. 1-66, (2005).

Tal, A., "Guidelines for Integrating DiskOnChip in a Host System," AO-DOC-1004, Rev. 1.0, M-Systems Flash Disk Pioneers Ltd., pp. 1-15, (2004).

OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, Samsung Electronics, pp. 1-125, (Dec. 23, 2005).

Kennedy, J., et al., "A 2Gb/s Point-to-Point Heterogeneous Voltage Capable DRAM Interface for Capacity-Scalable Memory Subsystems," ISSCC 2004/Session 1/Dram/11.8, IEEE International Solid-State Circuites Conference (2004), vol. 1, pp. 214-523.

Kim, Jae-Kwan, et al., "A 3.6 Gb/s/pin Simulataneous Bidirectional (SBD) I/O Interface for High-Speed Dram", ISSCC 2004/Session 22/DSL and Multi-Gb/s I/O 22.7, IEEE International Solid State Circuits Conference (2004), vol. 1, pp. 414-415.

"Hyper Transport TM I/O Link Specification", Revision 2.00, Document No. HTC20031217-0036-00, HyperTransportTM Technology Consortium, pp. 1-325 (2001).

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima et al."High Speed Memory Architectures for Multimedia Applications", Circuits Devices, IEEE 8755/3996/97/, pp. 18-13, Jan. 1997.

Gjessing, S., et al., "RamLink: A High-Bandwidth Point-to-Point Memory Architecture", IEEE 0-8186-2655-0/92, pp. 328-331, Feb. 24-28, 1992.

Gjessing, S., et al., "RamLink: A High-Bandwidth Point-to-Point Memory Architecture", Proceedings of the Twenty-Seventh Annual Hawaii International Conference on System Sciences, IEEE 1060-3424/94, pp. 154-162, 1994.

Gjessing, S., et al., "A RAM link for high speed", Special Report/Memory, IEEE Spectrum, pp. 52-53, (Oct. 1992).

Diamond, S.L., "SyncLink: High-speed DRAM for the future", Micro Standards, IEEE Micro, pp. 74-75, (Dec. 1996).

"DDR2 Fully Buffered DIMM 240pin FBDIMMS based on 512Mb C-die", Rev. 1.3 Sep. 2006, Samsung Electroncs, pp. 1-32 (Sep. 2006).

"Hyper Transport TM I/O Link Specification", Revision 3.00, Document No. HTC20051222-0046-0008, HyperTransport Technology Consortium, pp. 1-428 (Apr. 2006).

* cited by examiner

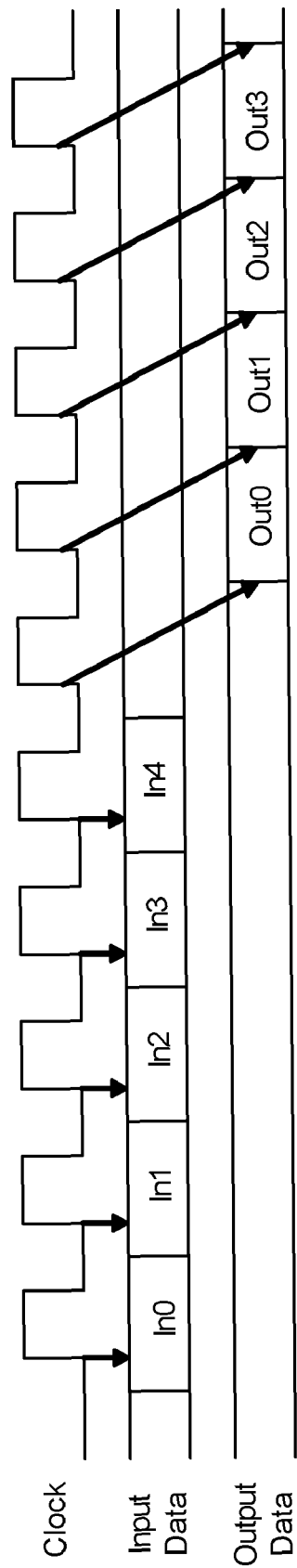
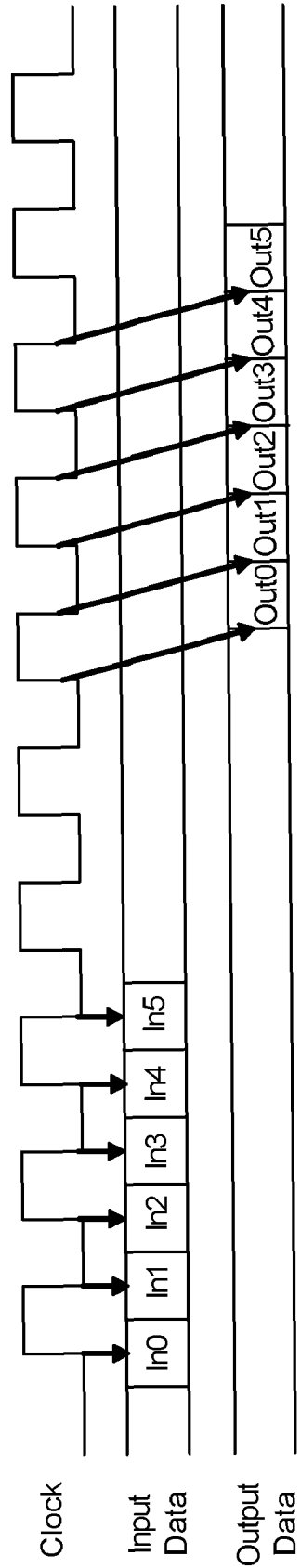
FIG. 2A
FIG. 2B

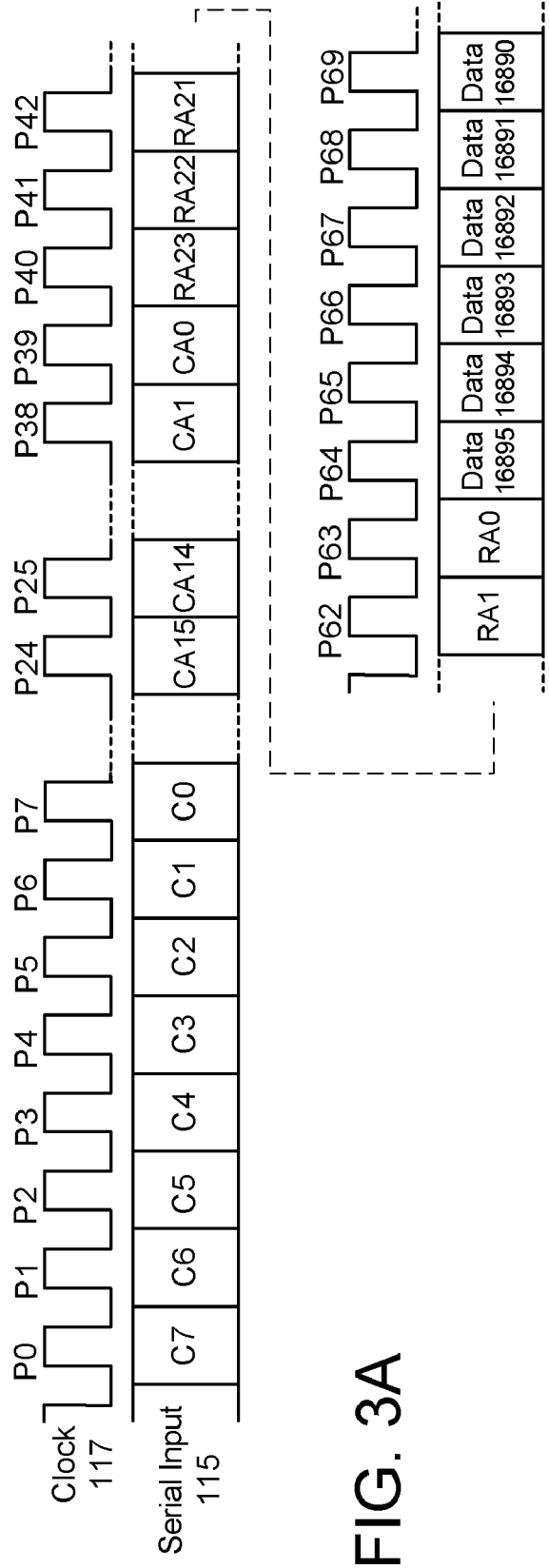
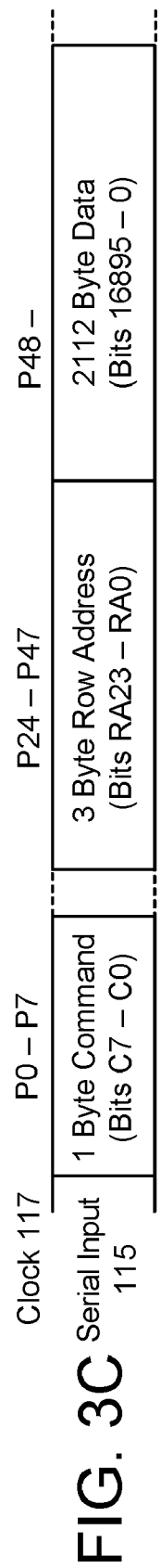
FIG. 3A
FIG. 3B
FIG. 3C

| Clock 117 | P0 – P7 | P24 – P39 | P40 – P63 | P64 – |
|---|---|---|---|---|
| Serial Input 115 | 1 Byte Command (Bits C7 – C0) | 2 Byte Column Address (Bits CA15 – CA0) | 3 Byte Row Address (Bits RA23 – RA0) | 2112 Byte Data (Bits 16895 – 0) |

FIG. 13A

| Clock 117 | P0 – P7 | P24 – P39 | P40 – P63 | P64 – |
|---|---|---|---|---|
| Serial Input 115 | 1 Byte Command (Bits C7 – C0) | 2 Byte Column Address (Bits CA15 – CA0) | 3 Bytes (Dummy) | 2112 Byte Data (Bits 16895 – 0) |

FIG. 13B

| Clock 117 | P0 – P7 | P24 – P39 | P40 – P63 | P64 – |
|---|---|---|---|---|
| Serial Input 115 | 1 Byte Command (Bits C7 – C0) | 2 Bytes (Dummy) | 3 Byte Row Address (Bits RA23 – RA0) | Data Bytes (Bits 16895 – 0) |

FIG. 13C

APPARATUS AND METHOD FOR CAPTURING SERIAL INPUT DATA

FIELD OF THE INVENTION

The present invention relates generally to a data processing apparatus and method. More particularly, the present invention relates to an apparatus and a method for processing and capturing serial input data.

BACKGROUND OF THE INVENTION

Current consumer electronic devices use memory devices. For example, mobile electronic devices such as digital cameras, portable digital assistants, portable audio/video players and mobile terminals continue to require mass storage memories, preferably non-volatile memory with ever increasing capacities and speed capabilities. Non-volatile memory and hard disk drives are preferred since data is retained in the absence of power, thus extending battery life.

While existing memory devices operate at speeds sufficient for many current consumer electronic devices, such memory devices may not be adequate for use in future electronic devices and other devices where high data rates are desired. For example, a mobile multimedia device that records high definition moving pictures is likely to require a memory module with a greater programming throughput than one with current memory technology. While such a solution appears to be straightforward, there is a problem with signal quality at such high frequencies, which sets a practical limitation on the operating frequency of the memory. The memory communicates with other components using a set of parallel input/output (I/O) pins, the number of which depends on the desired configuration. The I/O pins receive command instructions and input data and provide output data. This is commonly known as a parallel interface. High speed operation may cause communication degrading effects such as cross-talk, signal skew and signal attenuation, for example, which degrades signal quality.

In order to incorporate higher density and faster operation on the system boards, there are two design techniques: serial interconnection configurations and parallel interconnection configurations such as multi-dropping. These design techniques may be used to overcome the density issue that determines the cost and operating efficiency of memory swapping between a hard disk and a memory system. However, multi-drop has a shortcoming relative to the serial interconnection of memory systems. For example, if the number of multi-drop memory system increases, as a result of loading effect of each pin, delay time also increases so that the total performance of the multi-drop system is degraded by the multi-drop connection caused by the wire resistor-capacitor loading and the pin capacitance of the memory device. A serial link in a device such as a memory device may utilize a single pin input that receives all address, command, and data serially. The serial link may provide a serial interconnection configuration to control command bits, address bits, and data bits effectively through the serial interconnection configuration. By providing a serial interconnection configuration, a memory device identifier (ID) number is assigned to each device on a chained configuration. Memory devices may be dynamic random access memories (DRAMs), static random access memories (SRAMs) or Flash memories.

For slower operating system applications, logic circuit combinations to capture data streams can be acceptable. However, in the case of high speed operation, the correct data capturing from single serial port to the assigned registers can not be ensured because of fast clock operation during command interpretation.

SUMMARY OF THE INVENTION

In accordance with one aspect of the present invention, there is provided a method for processing serial input (SI) including command, address and data in accordance with a pre-defined sequence and grouped for all bit streams representing the command, address and data. The method includes: receiving the SI; holding the bit streams of the received SI; interpreting the command of the received SI, independently of holding the bit streams; and accessing a memory in response to the interpreted command and based on the received SI.

For example, the step of interpreting is conducted during the step of holding being conducted. The step of interpreting includes: storing the command of the received SI; and decoding the stored command to determine operation control mode of the command.

The method may include receiving an enable input. In response to the received enable input, the receiving of the command of SI is enabled.

Advantageously, in response to the determined operation control mode, first and second clocks are generated separately. The first clock is used for interpreting the command. The second clock is used for holding the bit streams. The generation of the first clock ceases upon completion of the step of interpreting and the generation of the second clock ceases after the ceasing of the first clock generation, in accordance with the determined operation control mode.

For example, the step of accessing includes capturing the data of the received SI. The address of the bit stream in the received SI is temporarily stored and the temporarily stored address is transferred to access the memory based on the captured data.

Advantageously, the step of transferring includes establishing a path of the temporarily stored address in response to the operation control mode, so as to transfer the temporarily stored address therethrough. Transfer path information is provided according to the operation control mode to establish a path of the temporarily stored address.

In another example, the temporarily stored address is transferred through a pre-defined path. In the example, no path selection in accordance with the operation control mode is required.

In accordance with another aspect of the present invention, there is provided an apparatus for processing serial input (SI) including command, address and data in accordance with a pre-defined sequence and grouped for all input bit streams representing the command, address and data and for accessing a memory for data processing. The apparatus includes: a temporary holding circuit for temporarily storing the bit streams of the SI; an interpreting circuit for interpreting the command of the SI, independently of the bit streams being temporarily held by the temporarily holding circuit; and a data processing circuit for accessing the memory in response to the interpreted command and based on the SI.

For example, the interpreting circuit includes: a storing circuit for storing the command; and a decoding circuit for decoding the stored command to determine operation control mode of the command.

The apparatus may further include: a clock generation circuit for generating operation clocks in response to the operation control mode; and an address register circuit for storing the address of the bit stream temporarily stored in the temporary holding circuit to access the memory.

For example, the temporary holding circuit includes J temporary registers that are serially connected, so that one register forwards its stored bit stream to the next register. The address register circuit includes J address registers for storing the address transferred from the J temporary registers, J being an integer greater than one.

The path circuit may include a switch circuit for selecting address transfer paths between the J temporary registers and the J address registers, in accordance with address switching information of the operation control mode.

The path circuit may include a pre-defined transfer path for transferring the temporarily stored addresses from the J temporary registers to the J address registers therethrough.

In accordance with the embodiments, it is possible to capture serial input of an input port without losing any bit with multiple clocks that are generated internally by which command, address, and data are latched in the designated registers. In the embodiments of the present invention, by new type of multi-clock data capturing and on-the-fly data latching, a serial input processing apparatus captures serial input without losing any bit with multiple clocks that are generated internally by which command, address, and data are latched in the designated registers.

According to one embodiment of the present invention, there is provided a means for controlling temporary registers and generating the multiple clocks to latch bit data streams, instead of using a single common clock. In the embodiment, no interval time is required between serial command bits and next bit streams to decode commands. It enhances the speed of Flash memory interface.

In accordance with a further aspect of the present invention, there is provided an apparatus including a plurality of devices in a serial interconnection configuration, each of the devices having a serial input connection for receiving serial input data and a serial output connection for providing serial output data, each of the devices having an apparatus for capturing serial data. The device includes: a serial input circuit for receiving serial input (SI) of command, address and data according to a pre-defined sequence and grouped with a byte basis for all input bit streams representing the command, address and data; a temporary holding circuit for temporarily storing the bit streams of the received SI; an interpreting circuit for interpreting the command of the SI, independently of the command being held by the temporary holding circuit; and a data processing circuit for accessing the memory in response to the interpreted command and based on the received SI.

In accordance with yet a further aspect of the present invention, there is provided an apparatus for capturing data contained in serial input (SI) in a plurality of devices in a serial interconnection configuration, each of the devices having a serial input connection for receiving serial input data and a serial output connection for providing serial output data, the apparatus being adopted in at least one of the devices. The apparatus includes: a serial input circuit (SI) for receiving the SI of command, address and data according to a pre-defined sequence and grouped with a byte basis for all input bit streams representing the command, address and data; a command receiving circuit for storing bit streams of the command data; a command interpreting circuit for decoding the command data stored in the command register; a temporary holding circuit for storing bit streams temporarily, while the command data is being decoded in the command register; and an address switching circuit for making connection from the temporarily registers to address registers, in accordance with the command decoded by the command decoder.

In accordance with a yet further aspect of the present invention, there is provided a method for capturing serial data in a plurality of devices in a serial interconnection configuration, each of the devices having a serial input connection for receiving serial input data and a serial output connection for providing serial output data. The method includes: receiving serial data input of command, address and data according to a pre-defined sequence and grouped as byte based data for all input bit data streams representing the command, address and data; continuously storing bit streams of the command data; decoding the command data stored in the command register; continuously storing bit streams temporarily, while the command data is being decoded in the command register; and making connection from the temporarily registers to address registers, in accordance with the command decoded by the command decoder.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 2A illustrates a timing diagram of single data rate (SDR) operation of memory devices;

FIG. 2B illustrates a timing diagram of double data rate (DDR) operation of memory devices;

FIGS. 3A, 3B and 3C illustrate configurations of a serial input signal for use in an embodiment of the present invention shown in FIG. 1;

FIGS. 13A, 13B and 13C illustrate configurations of a serial input signal for use in another embodiment of the devices shown in FIG. 1;

DETAILED DESCRIPTION

Figure 1:
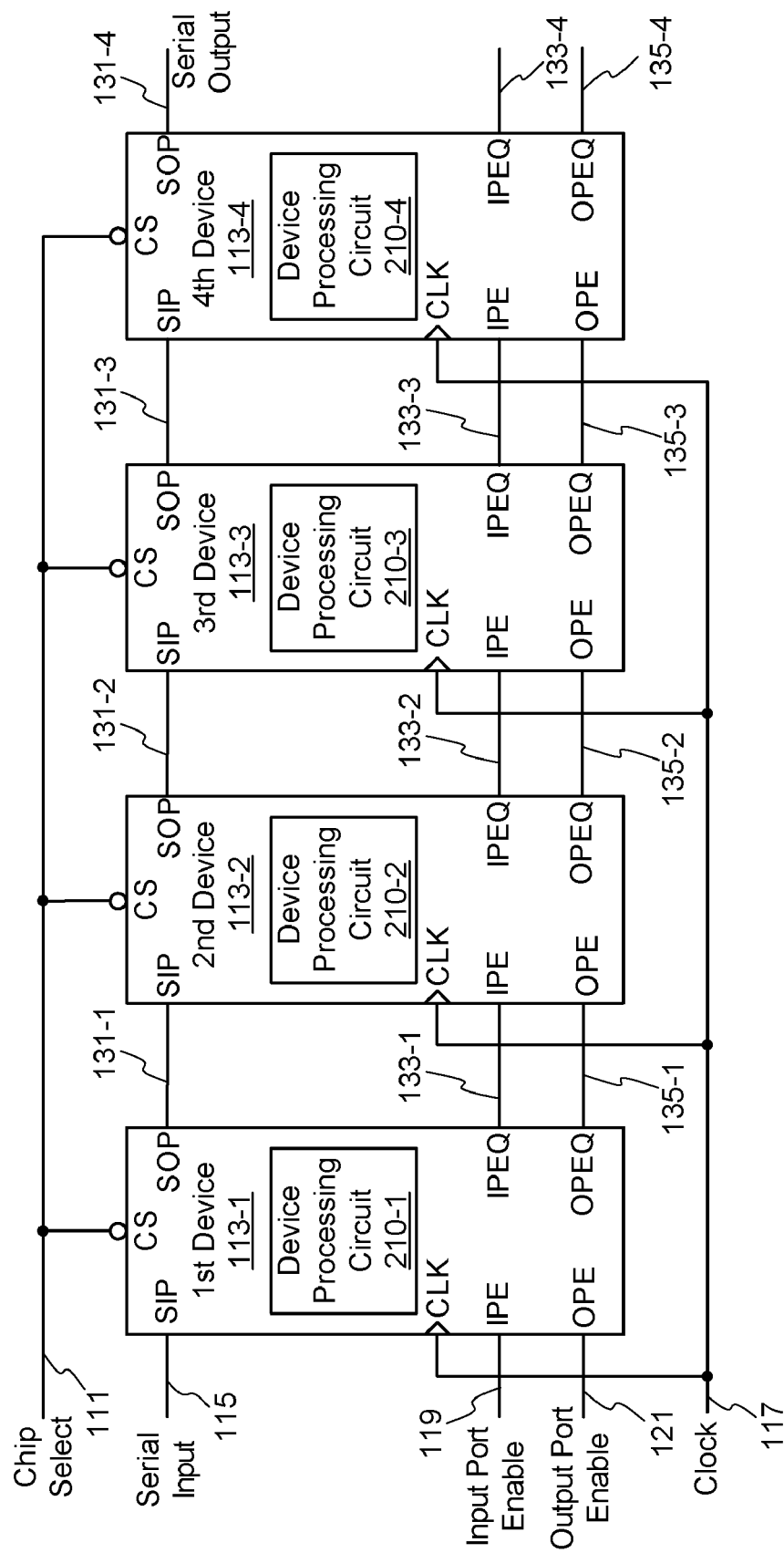
FIG. 1 is a block diagram illustrating memory devices employing a serial interconnection implementation to where one embodiment of the present invention is applied.

In the following detailed description of sample embodiments of the present invention, reference is made to the accompanying drawings which form a part hereof, and in which is shown by way of illustration of specific sample embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention provides apparatus and method for capturing serial input data. Embodiments of the present invention will now be described in conjunction with serially interconnected memory devices, e.g., a MISL (multiple independent serial link). A MISL interface includes the input/output circuits in the Flash memory for enhancing the operational performance without changing the core structure. It is an innovation of interface and data processing of Flash memory. Due to the restriction of Flash cell structure and fundamental low performance of the cell, the enhancement of Flash performance has been a key issue to be resolved in the memory industry. Most products including Flash memory core have parallel ports that latches simultaneously all address bits, all command bits, and all data bits, respectively. A serial link utilizes a single pin input for receiving all address, command, and data serially. A detail of MISL is described in U.S. patent application Ser. No. 11/324,023 filed Dec. 30, 2005, U.S. Provisional Patent Application No. 60/787,710 entitled "Serial Interconnection of Memory Devices" filed Mar. 28, 2006, and U.S. Provisional Patent Application No. 60/802,645 entitled "Serial Interconnection of Memory Devices" filed May 23, 2006, the contents of which are entirely incorporated herein by reference.

A MISL provides very unique input sequences to support diverse operation modes with a serial input port. Therefore, in accordance with the type of command input, the byte length of following bit streams and total number of input bytes are varied. In the case of high frequency operation over 200 MHz, if there is no temporary register to hold bit data until command bit interpretation is completed, the correct data capturing from the single serial port to the assigned registers, may not be ensured because of fast clock operation during command interpretation. As known in Flash memories, in accordance with command input, the following byte configuration and length after command bytes can be changed.

In order to capture data without losing any single bit received at the input port, the previous scheme in which single clock control and fast logic is used to quickly receive the next bytes of data is inappropriate due to the high speed operation with very high frequency clock in a system application.

A MISL adopts serial input and output ports so that an output buffer transfers the command and address to next device if they are combined together with serial interconnection along with real data output results from the memory core. In the case of data output, a related output buffer is controlled by OPE (output port enable) while an input buffer is enabled by IPE (input port enable) for the command and address serial strings. Only OPE control for the output buffer does not allow transferring command and address serial strings to next device. This function is only valid in the serial connection. Even a single device can have the same function to maintain the same level of control over a single device.

A MISL interface will use several serial-to-parallel registers to capture serial data and group them as byte based data for all input bit data streams. Only single pin SI (serial input) receives commands, addresses, and data according to the pre-defined sequence in the form of serial data from a system controller.

FIG. 1 shows memory devices employing a serial connection implementation where serial and single input and output ports are employed for the connected multiple memory devices or serially interconnected devices in a memory system. In FIG. 1, each rectangular block represents a memory device. The core of each memory device can include dynamic random access memory (DRAM) cells, static random access memory (SRAM) cells, Flash memory cells, or the like. As shown in FIG. 1, the serial input port (SIP) and the serial output port (SOP) are serially connected between neighboring memory devices, but the clock input (CLK) of each device is connected with a common link. In this example, the performance of a memory system can be determined, for example, by the loading of the clock. FIG. 1 can alternatively be referred to as a hybrid type of the serial interconnection.

The clocks are used to latch input data streams at pre-defined registers in order to store bit information before the start of a memory core operation. The embodiment has a serial input (SI), which is latched at the rising edge of the clock or both edges (rising and falling) of the clock, depending upon the interface type. For example, if a single data rate (SDR) is adopted as the interface type of the system, the rising edge of the clock latches input data. In case of a double data rate (DDR) interface type, both edges of clock latches input streams to speed up the write and read operations. It is possible to process all data types (device number data, command data, address data, input data) through the SDR or DDR operation. Both types of data rate interface (SDR or DDR) can be employed. Also, it is possible to implement other types of interfaces such as QDR (quadruple data rate) and the like.

Referring to FIG. 1, the clock is commonly fed to the devices. In this example, a chip select signal 111 is commonly fed to chip select inputs CS of all devices. The serial connected devices are first-fourth devices 113-1-113-4, for example. When the chip select signal 111 is logic "low", the first-fourth devices 113-1-113-4 are enabled at the same time, so that the input data contained in a serial input (SI) signal 115 is transferred from the first device 113-1 to the last device 113-4 through all device activation. There is clock latency while data is transferred through the devices. In the serial connection, a serial clock signal 117 is commonly fed to the clock inputs CLK of the devices 113-1-113-4 of the serial interconnection configuring a memory system. The first device 113-1 is enabled by an input port enable signal 119 fed to an input port enable input IPE thereof to process data, and its data output operation is enabled by an output port enable signal 121 fed to an output port enable input OPE thereof. The first device 113-1 provides an input port enable output signal 133-1 and an output port enable output signal 135-1 from its input port enable output IPEQ and output port enable output OPEQ thereof to the second device 113-2. Similarly, each of the other devices 113-2-113-4 is enabled by its input and output enable signals fed to its IPE and OPE inputs and the input port enable and output port enable output signals are provided from its IPEQ and OPEQ outputs.

The chip select signal 111, the serial input signal 115, the clock signal 117, the input port enable signal 119 and the output port enable signal 121 are provided by a memory controller (not shown). Serial output signals 131-1-131-3, input port enable output signals 133-1-133-3, and output port enable output signals 135-1-135-3 of the first-third devices 113-1-113-3 are provided to next devices 113-2-113-4, respectively. The fourth device 113-4 also provides a serial output signal 131-4, an input port enable output signal 133-4 and an output port enable output signal 135-4. The serial output signal 131-4 is the serial output signal of the entire serial interconnection of devices.

The first-fourth device 113-1-113-4 have first-fourth device processing circuits 210-1-210-4 therein, respectively. Each of the device processing circuits performs the functions of controlling its device and data processing in response to the serial input signal and the control signals. The processed data of each device is provided to the next device.

FIG. 2A shows a relative timing sequence for single data rate (SDR) operation of memory devices. FIG. 2B shows a relative timing sequence for double data rate (DDR) operation of memory devices. Each drawing shows operations in one port. In each of SDR and DDR operations, the chip select signal is commonly connected to enable all devices at the same time, so that input data of the first device is transferred to the last device.

The sequence structure of the command, address, and data in the serial input is pre-defined and grouped for all bit streams. An example group of command definition is: (i) only command; (ii) command+one byte data; (iii) command+column address; (iv) command+column address+2112 byte data; (v) command+column and row addresses+2112 byte data; (vi) command+column and row addresses; (vii) command+row address; and (viii) command+row address+2112 byte data. As such, the structure of the serial input bit streams is flexible and bit allocations after the command are not fixed.

FIGS. 3A, 3B and 3C depict the configuration of the serial input signal 115 provided to the first device 113-1 shown in FIG. 1. While the grouped bit stream includes a device number (DN) (one byte), it is not shown here. The configuration shown in FIG. 3A is an example of above (v) command+column and row addresses+2112 byte data (two byte column and three byte row addresses). The configuration shown in FIG. 3B is an example of above (iv) command+column address+2112 byte data (two byte column address). The configuration shown in FIG. 3C is an example of above (viii) command+row address+2112 byte data (three byte row address).

Each data bit in the serial input is provided in response to each pulse of the clock signal 117. In the examples, the first eight bits (i.e., one byte) representing command bits C7-C0 are synchronized to clocks P0-P7. In the example shown in FIG. 3A, column address bits CA15-CA0 (of two bytes) are synchronized to clocks P24-P39, row address bits RA23-RA0 (of three bytes) are synchronized to clocks P40-P63, and data bits Data 16895, 16894, - - - (of 2112 bytes) are synchronized to clocks P64 and on. In the example shown in FIG. 3B, column address bits CA15-CA0 (of two bytes) are synchronized with clocks P24-P39, and data bits Data 16895, 16894, - - - (of 2112 bytes) are synchronized with clocks P40-. In the example shown in FIG. 3C, row address bits RA23-RA0 (of three bytes) are synchronized with clocks P24-P47, and data bits Data 16895, 16894, - - - (of 2112 bytes) are synchronized with clocks P48-. The serial input includes other information data, for example, bank addresses and device addresses (not shown). The command configuration in the serial input bit streams is flexible. The configuration of the serial input may be arranged differently according to specific applications.

Figures 4A, 4B:
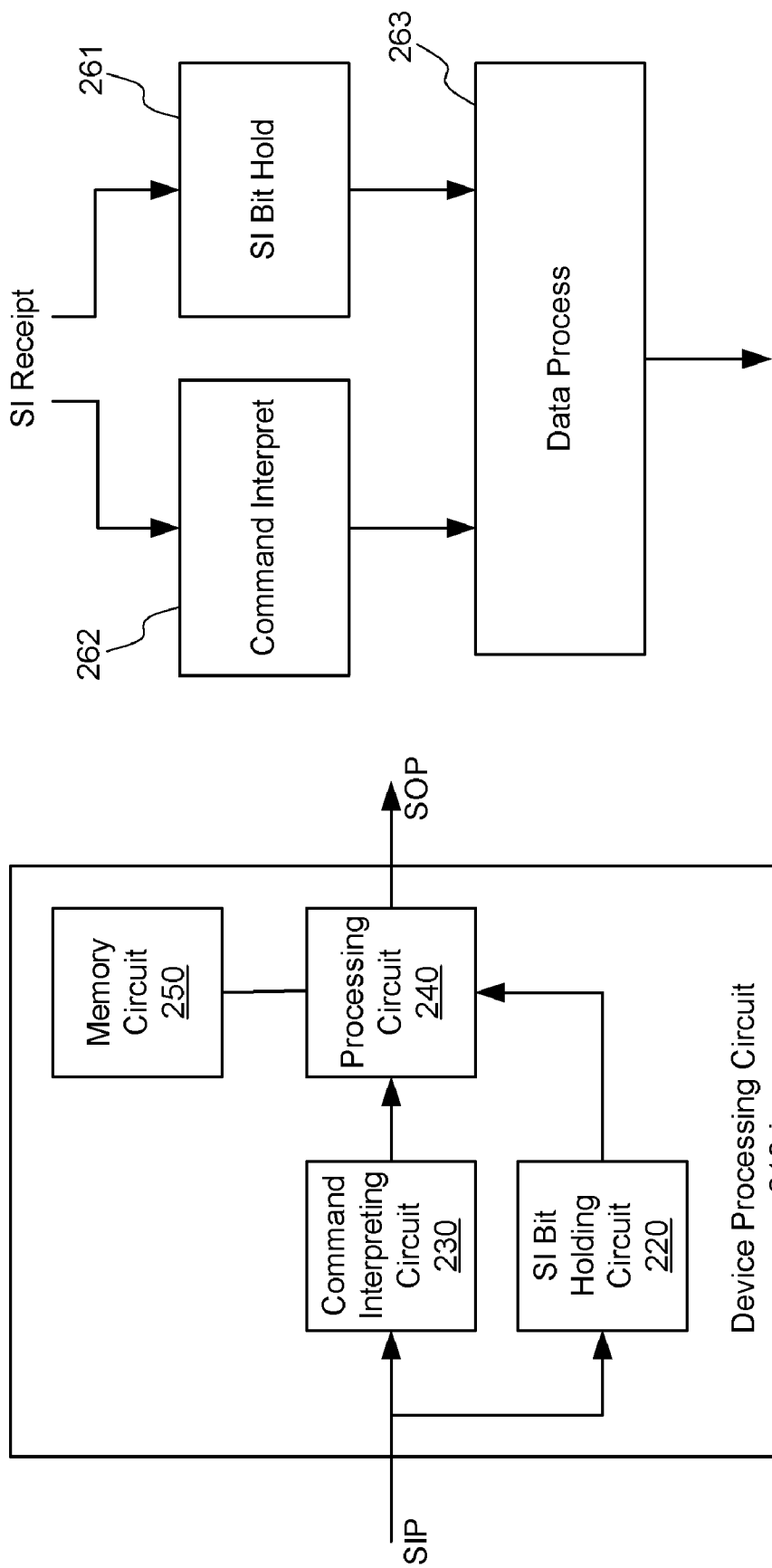
FIG. 4A is a block diagram illustrating a device processing circuit included in a device shown in FIG. 1.
FIG. 4B is a flow chart of operation of the device processing circuit shown in FIG. 4A.

FIG. 4A shows an example implementation of each of the first-fourth device processing circuit 210-1-210-4 shown in FIG. 1. FIG. 4B shows operation of the device processing circuit shown in FIG. 4A. Referring to FIGS. 4A and 4B, a device processing circuit 210-1, which represents the device processing circuits, includes a serial input (SI) bit holding circuit 220, a command interpreting circuit 230, a processing circuit 240 and a memory circuit 250. The serial input SI includes command, address and data in accordance with a pre-defined sequence and grouped for all bit streams. The device processing circuit 210-i receives the bit stream. The bits of the serial input SI are held in the serial bit holding circuit 220 (step 261). The command interpreting circuit 230 interprets the command bits of the serial input SI (step 262). The bit holding is performed independently of the command interpreting. In response to the interpreted command and the held SI bits, the processing circuit 240 performs data processing with access to the memory circuit 250 (step 263). The processed data is outputted through the serial output port (SOP) to the next device. In an example, the command interpreting and the bit holding are performed in parallel. It is a preferable example wherein the command interpreting is performed while the bit holding is performed.

Figure 5A:
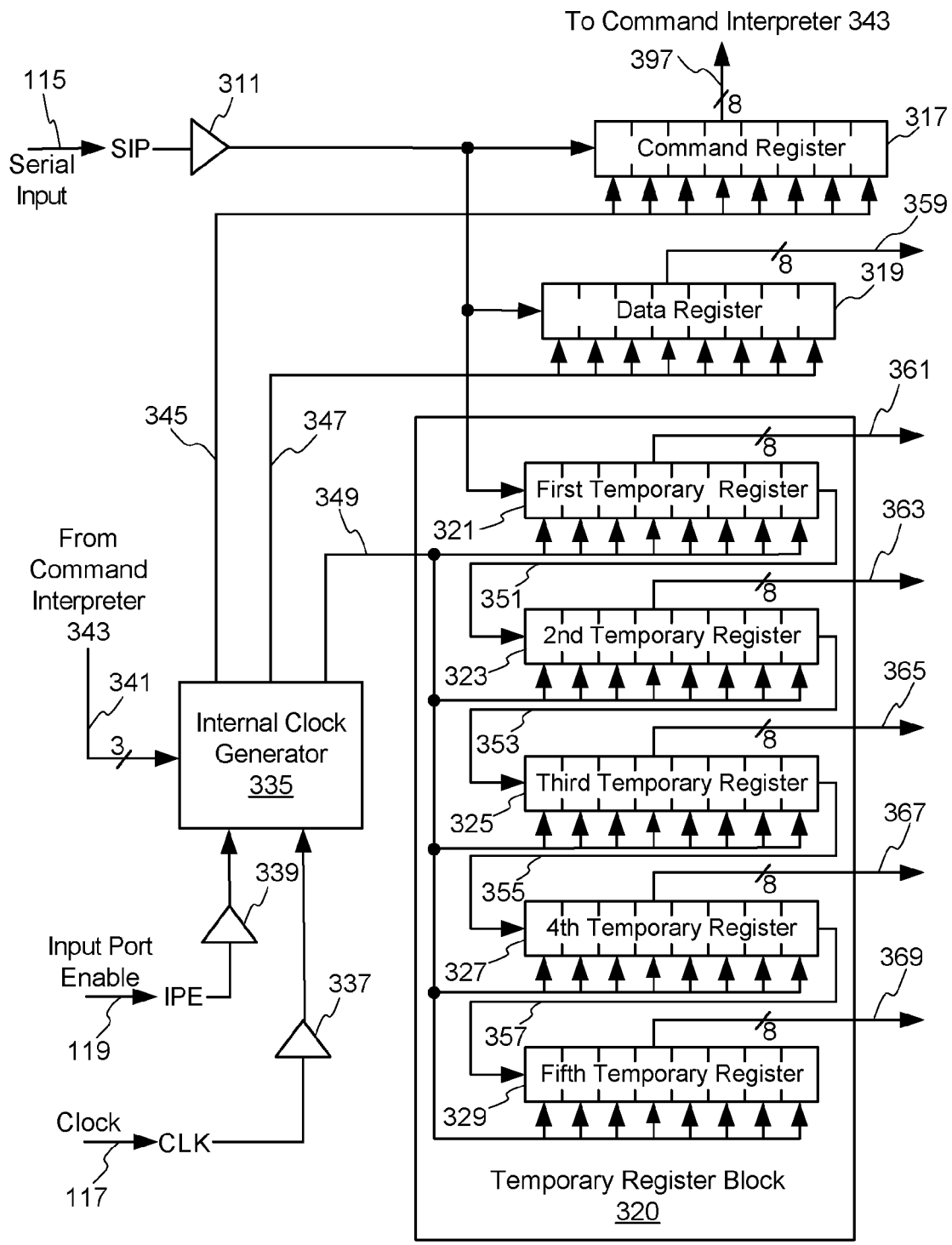
FIGS. 5A, 5B and 5C illustrate one of the devices shown in FIG. 1 in accordance with an embodiment of the present invention.
Figure 5B:
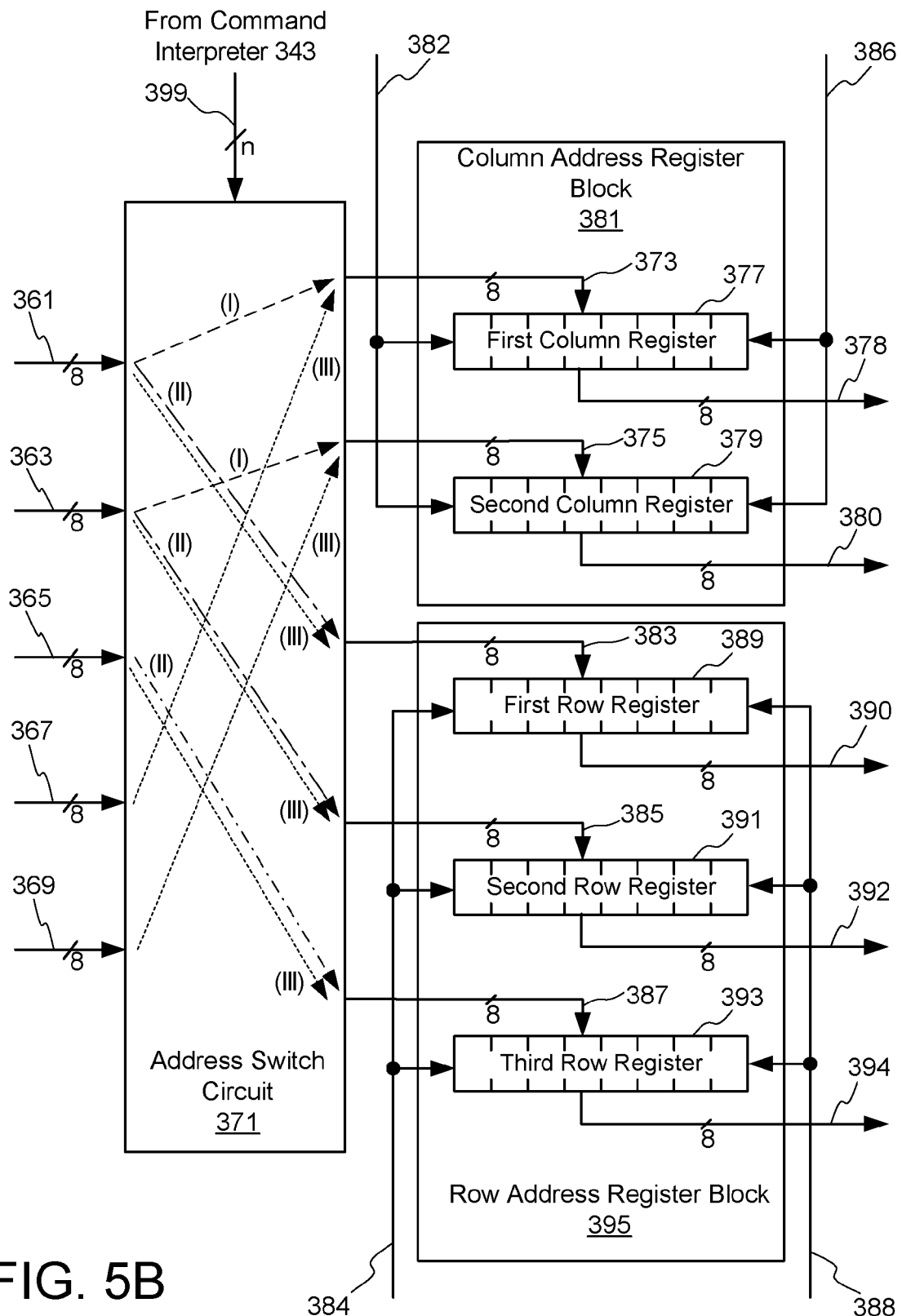
Figure 5C:
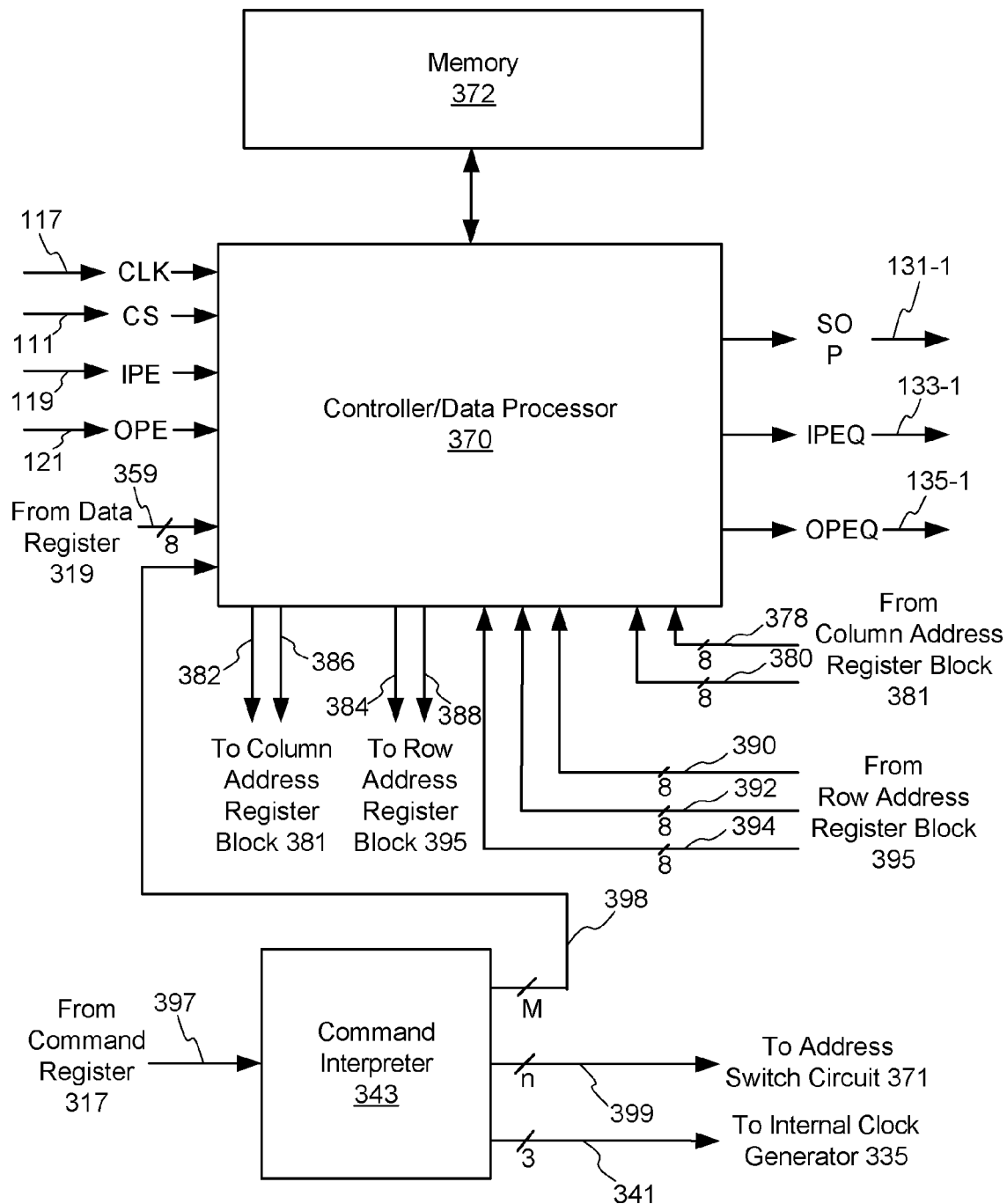

FIGS. 5A, 5B and 5C show a detailed circuit of the first device 113-1 shown in FIG. 1. Each of the second-fourth devices 113-2-113-4 has the same structure as that of the first device 113-1. The first device 113-1 receives the serial input as shown in FIG. 3.

Referring to FIGS. 5A-5C, the serial input signal 115 contains commands, addresses and data in the form of a serial input signal and fed through the serial input port (SIP) to an SIP input buffer 311. The serial input signal 115 is fed to a command register 317, a data register 319 and a temporary register block 320 having a plurality of temporary registers (J registers, J being an integer greater than one). In this particular example, the temporary register block 320 includes five (=J) registers: i.e., first, second, third, fourth and fifth temporary registers 321, 323, 325, 327 and 329. Each of the command register 317, the data register 319 and the first temporary register 321 receives the commands, addresses and data contained in the serial input signal 115 sequentially.

The clock signal 117 and the input port enable signal 119 are fed to an internal clock generator 335 through a clock input buffer 337 and an IPE input buffer 339, respectively. The internal clock generator 335 receives an operation mode group signal 341 of three bits from a command interpreter 343, so that the generator 335 is enabled to generate clocks. The internal clock generator 335 produces a command register clock signal 345, a data register clock signal 347 and a temporary register clock signal 349 locally. The command register clock signal 345 is fed to the command register 317. The data register clock signal 347 is fed to the data register 319. The temporary register clock signal 349 is fed to the first-fifth temporary registers 321-329 of the temporary register block 320.

In response to the data on the serial input signal 115 to SIP, the command register 317 provides a registered command output signal 397 to the command interpreter 343 which provides the operation mode group signal 341 to the internal clock generator 335. Also, the command interpreter 343 provides a decoded instruction signal 398 of M bits and an address switch control signal 399 of n bits. The address switch control signal 399 is fed to an address switch circuit 371. The decoded instruction signal 398 is fed to a controller/data processor 370. The controller/data processor 370 receives the clock signal 117, the chip select signal 111, the input port enable signal 119 and the output port enable signal 121. The controller/data processor 370 controls the device and provides the input port enable output signal 133-1 and the output port enable output signal 135-1, respectively. Also, the controller/data processor 370 receives the registered data output signal 359 and performs the function of data access (write and/or read) to a memory 372. The processed data is outputted in response to the chip select signal 111, the clock signal 117 and the output port enable signal 121. The outputted data is included in the serial output signal 131-1.

In the temporary register block 320, the first-fifth temporary registers 321-329 are serially connected. The eight bit data stored in one register is shifted out and into the next register in response to the clocks fed to the temporary register clock signal 349. A first temporary address signal 351 from the first temporary register 321 is fed to the second temporary register 323, the second temporary address signal 353 from which is fed to the third temporary register 325. A third temporary address signal 355 from the third temporary register 325 is fed to the fourth temporary register 327, the fourth temporary address signal 357 from which is fed to the fifth temporary register 329.

First-fifth temporary address output signals 361-369, each being an eight bit signal, from the first-fifth temporary registers 321-329 are fed to the address switch circuit 371 that includes a plurality of internal logic switches (not shown) having various logic gates, transmission gates, tri-state inverters. The address switch circuit 371 transfers the first-fifth temporary address output signals to an address register block having a plurality of address registers (J registers). In the embodiment, the address register block includes a column address register block 381 having K registers and a row address register block 395 having (J-K) registers, K being an integer greater than one. In this particular example, K is two. The address switch circuit 371 provides a first column address input signal 373 and a second column address input signal 375 to a first column register 377 and a second column register 379, respectively, of the column address register block 381, and a first row address input signal 383, a second row address input signal 385 and a third row address input signal 387 to a first row register 389, a second row register 391 and a third row register 393, respectively, of the row address register block 395.

In response to a column address latch signal 382, the eight bit data of each of the first and second column address input signals 373 and 375 is simultaneously latched in the first and second column registers 377 and 379, respectively. Similarly, in response to the row address latch signal 384, the eight bit data of each of the first, second and third row address input signals 383, 385 and 387 is simultaneously latched in the first, second and third row registers 389, 391 and 393, respectively. Each eight bit data latched in the first and second column registers 377 and 379 is read in response to a column address read signal 386. Each eight bit data latched in the first, second and third row registers 389, 391 and 393 is read in response to a row address read signal 388. The column address latch signal 382, the row address latch signal 384, the column address read signal 386, and the row address read signal 388 are provided by the controller/data processor 370. The eight bit data read from the registers 377, 379, 389, 391 and 393 is contained in a first column address signal 378, a second column address signal 380, a first row address signal 390, a second row address signal 392 and a third row address signal 394, respectively, that is fed to the controller/data processor 370.

Figure 6:
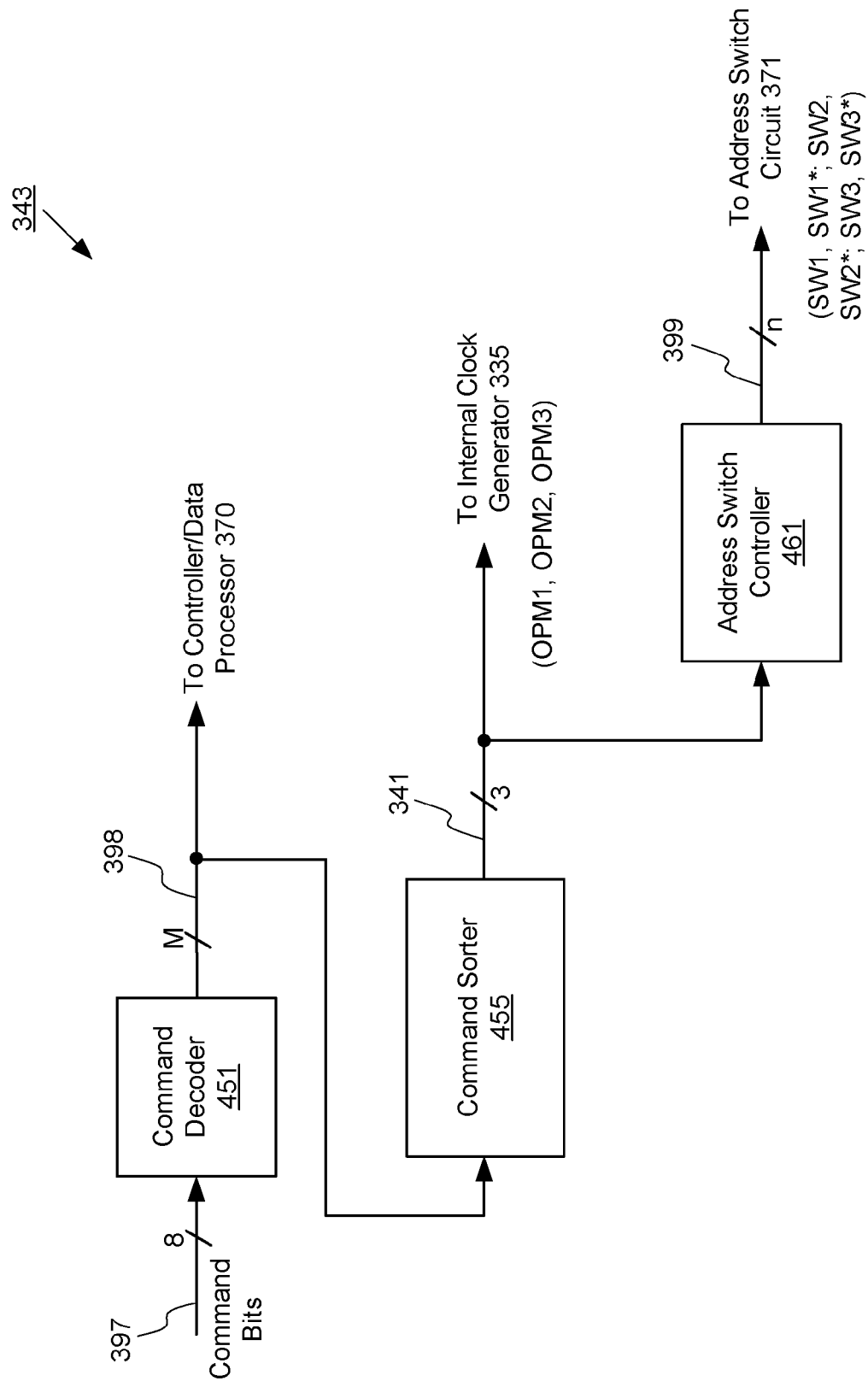
FIG. 6 is a block diagram illustrating a command interpreter shown in FIG. 5C.

FIG. 6 shows a more detailed circuit of the command interpreter 343 shown in FIG. 5C. The command interpreter 343 is a combined logic circuit for controlling the local and internal clock generation and the address switch circuit in accordance with the input command types. Referring to FIG. 6, the registered command output signal 397 having eight command bits is fed to a command decoder 451 which in turn provides the decoded instruction signal 398 having M bits that are provided as internal instructions. From the command decoder 451, based on "command bits" input of the registered command output signal 397, internal instructions are generated. M bits denote the number of instructions to be executed into the device. The decoded instruction signal 398 is fed to a command sorter 455 which in turn provides the operation mode group signal 341 to an address switch controller 461. By the command sorter 455, the pre-defined command categories of device controls are determined. In accordance with the determined control category, the operation mode group signal 341 is generated and fed to the address switch controller 461. The operation mode group signal 341 contains three bit operation mode signals OPM1, OPM2 and OPM3. The generation of operation mode signals OPM1, OPM2 and OPM3 will be later described with reference to FIG. 7.

The address switch controller 461 provides the address switch control signal 399 having n bits containing switch control signals SW1, SW1*, SW2, SW2*, SW3 and SW3*. The generation of signals SW1, SW1*, SW2, SW2*, SW3 and SW3* will be later described with reference to FIG. 11. Referring to FIGS. 5A-5C and 6, the operation mode group signal 341 of three bits is provided as the operation mode group signal 341 to the internal clock generator 335. As described above, in response to the temporary register clock signal 349, the registers of the temporary register block 320 stores column and row addresses. The sequence of addresses is established by the input commands. Using the operation mode signals, n bits controls are generated and sent to the address switch circuit 371.

Figure 7:
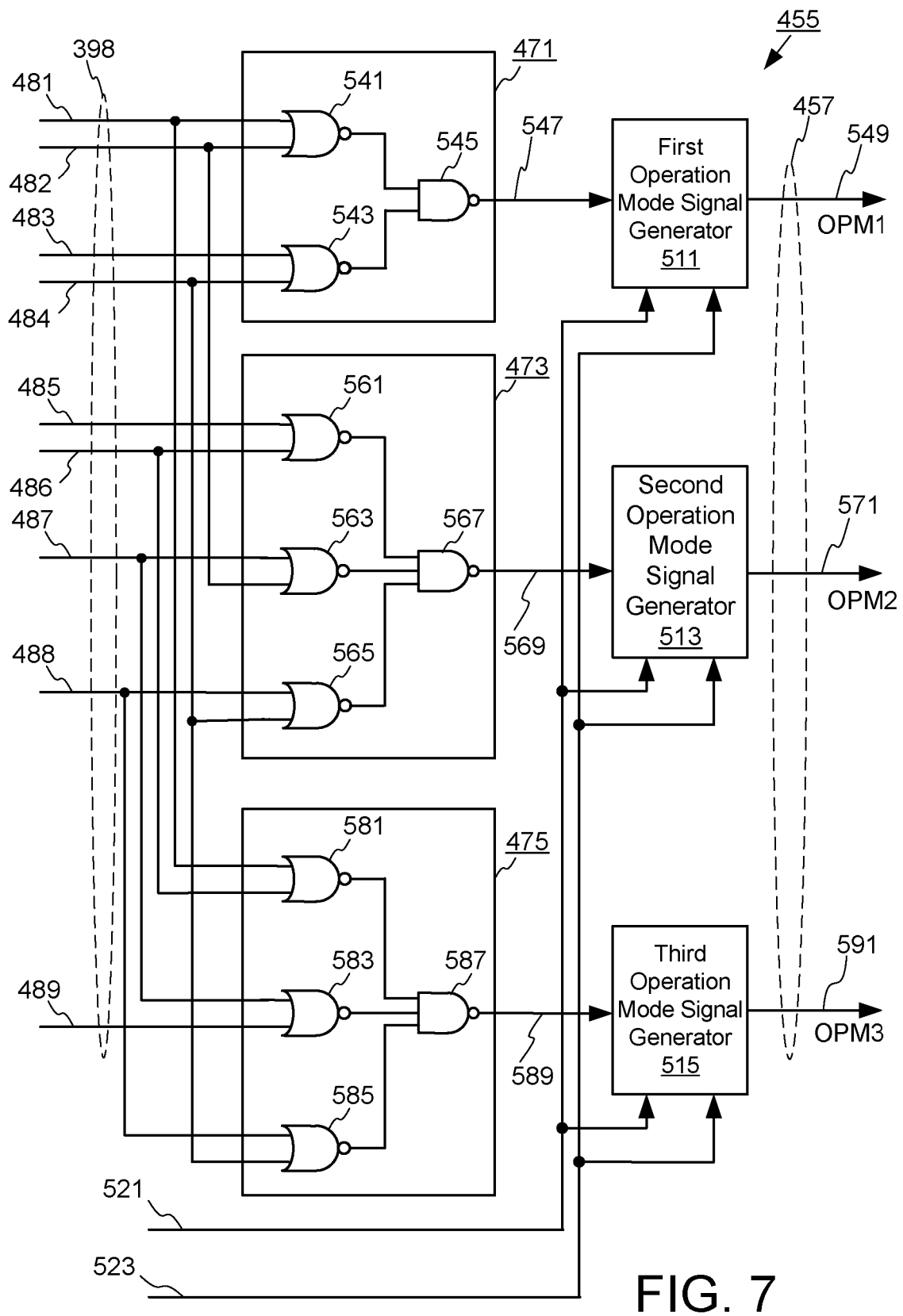
FIG. 7 is a block diagram illustrating a command sorter shown in FIG. 6.

FIG. 7 shows a more detailed circuit of the command sorter 455 shown in FIG. 6. The command sorter 455 receives the decoded instruction signal 398 from the command decoder 451 shown in FIG. 6. Referring to FIG. 7, the command sorter 455 includes first, second and third command logic circuits 471, 473 and 475 and first, second and third operation mode signal generators 511, 513 and 515. The first command logic circuit 471 includes two NOR gates 541 and 543 and a NAND gate 545. The second command logic circuit 473 includes three NOR gates 561, 563 and 565 and a NAND gate 567. The third command logic circuit 475 includes three NOR gates 581, 583 and 585 and a NAND gate 587.

In this example, the commands of SI are "page read", "random data input", "write configuration", "bank select", "random data read", "page read copy", "target address for copy", "block erase" and "serial data input". Other commands are also included. These commands (represented by eight command bits) are decoded by the command decoder 451 of the command interpreter 343 and provided thereby as the decoded instruction signal 398 of M bits containing a plurality of decoded signals 481-489. The signal 481 contains a decoded page read command. The signal 482 contains a decoded random data input command. The signal 483 contains a decoded write configuration command. The signal 484 contains a decoded bank select command. The signal 485 contains a decoded random data read command. The signal 486 contains a decoded page read copy command. The signal 487 contains a decoded target address for copy command. The signal 488 contains a decoded block erase command. The signal 489 contains a decoded serial data input command.

The page read command signal 481 and the random data input command signal 482 are fed to the NOR gate 541. The write configuration command signal 483 and the bank select command signal 484 are fed to the NOR gate 543. The logic output signals of the NOR gates 541 and 543 are fed to the NAND gate 545, the output of which is provided as the first command logic signal 547 of the first command logic circuit 471. The signal 547 is fed to the first operation mode signal generator 511.

The random data read command signal 485 and the page read copy command signal 486 are fed to the NOR gate 561. The target address for copy command signal 487 and the random data input command signal 482 are fed to the NOR gate 563. The block erase command signal 488 and the bank select command signal 484 are fed to the NOR gate 565. The logic output signals from the NOR gates 561, 563 and 565 are fed to the NAND gate 567, the output of which is provided as the second command logic signal 569 of the second command logic circuit 473. The signal 569 is fed to the second operation mode signal generator 513.

The page read command signal 481 and the page read copy command signal 486 are fed to the NOR gate 581. The target address for copy command signal 487 and the serial data input command signal 489 are fed to the NOR gate 583. The block erase command signal 488 and the bank select command signal 484 are fed to the NOR gate 585. The logic output signals from NOR gates 581, 583 and 585 are fed to the NAND gate 587, the output of which is provided as the third command logic signal 589 of the third command logic circuit 475. The signal 589 is fed to the third operation mode signal generator 515.

The first, second and third operation mode signal generators 511, 513 and 515 also receive a change flag signal 521 and a reset signal 523. The first, second and third operation mode signal generators 511, 513 and 515 provide first, second and third operation mode signals 549, 571 and 591 ("OPM1", "OPM2" and "OPM3"), respectively, that are contained by the operation mode group signal 341.

Figure 8:
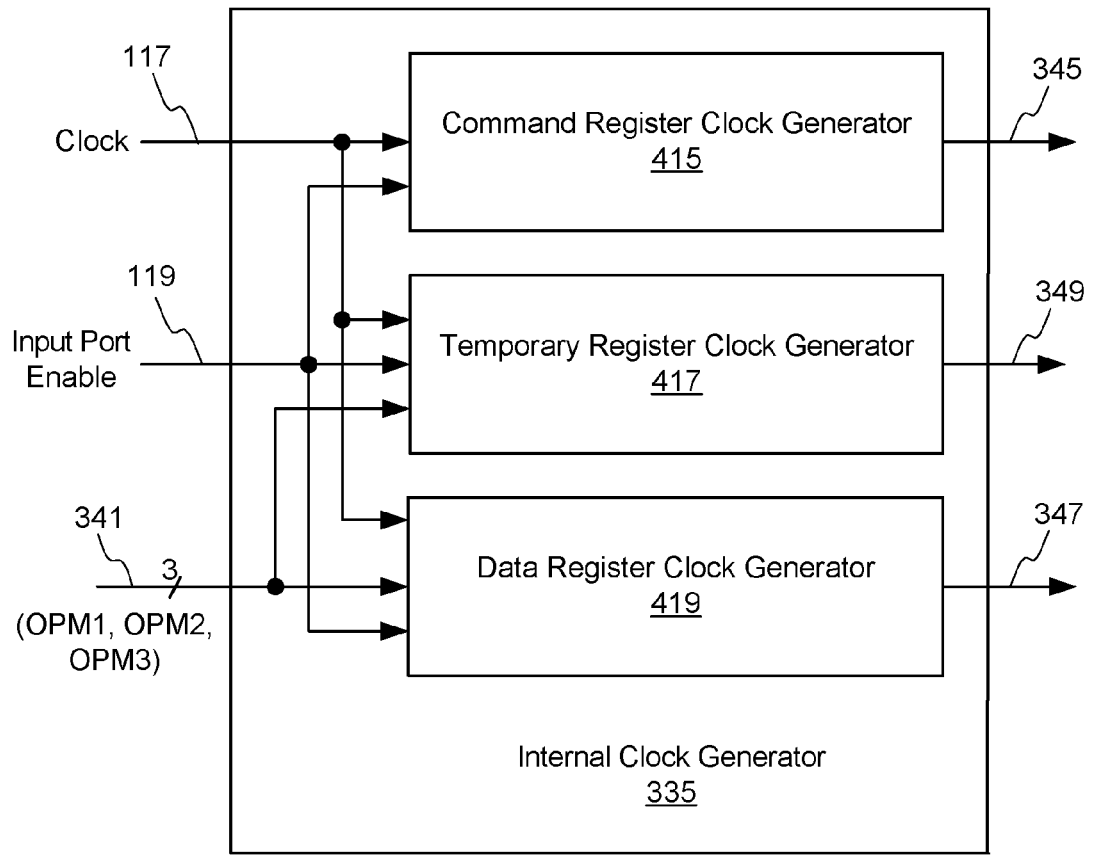
FIG. 8 is a block diagram illustrating an internal clock generator shown in FIG. 5A.
Figure 9A:
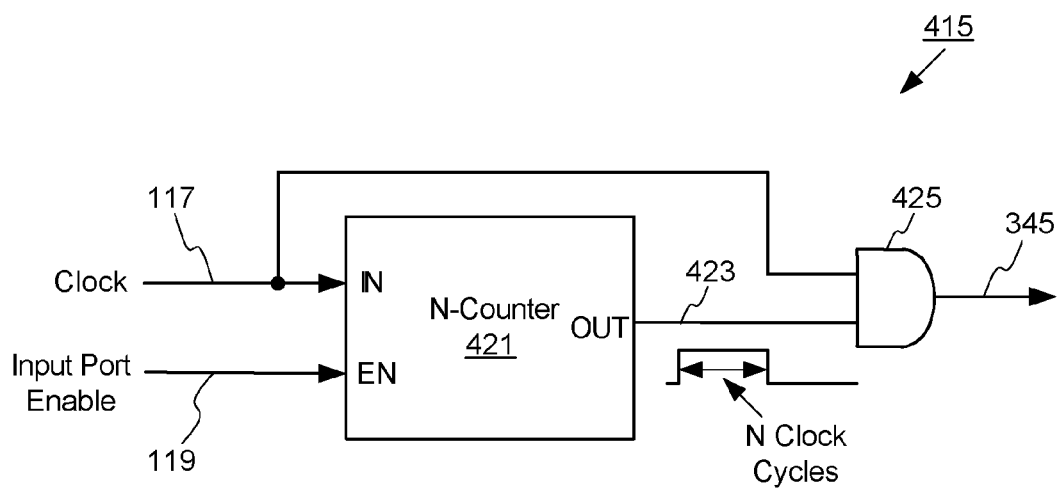
FIG. 9A is a block diagram illustrating a command register clock generator included in the internal clock generator shown in FIG. 8.

FIG. 8 shows a more detailed circuit of the internal clock generator 335 shown in FIG. 5A. Referring to FIGS. 5A and 8, the internal clock generator 335 includes a command registrar clock generator 415, a temporary register clock generator 417 and a data register clock generator 419. As shown in FIG. 9A, the command register clock generator 415 includes an N-counter 421 having a clock input IN for receiving the clock signal 117 and an enable input EN for receiving the input port enable signal 119. The counter 421 has a count output OUT for providing its count output signal 423 to an AND gate 425 which in turn provides the command register clock signal 345. The clock signal 117 is also fed to the AND gate 425. The counter 421 is activated by the input port enable signal 119 and counts pulses of the clock signal 117. When the count reaches N (e.g., eight), the counting ends, so that the registration of the SI in the command register 317 ends. The count output signal 423 is "high" during counting N (i.e., eight clock cycles corresponding to one byte). Thus, by gating in response to the count output signal 423, the AND gate 425 outputs N (i.e., eight) clocks that are to be contained in the command register clock signal 345. In this example, N represents the number of bits of the command (see FIGS. 3A-3C).

Figure 9B:
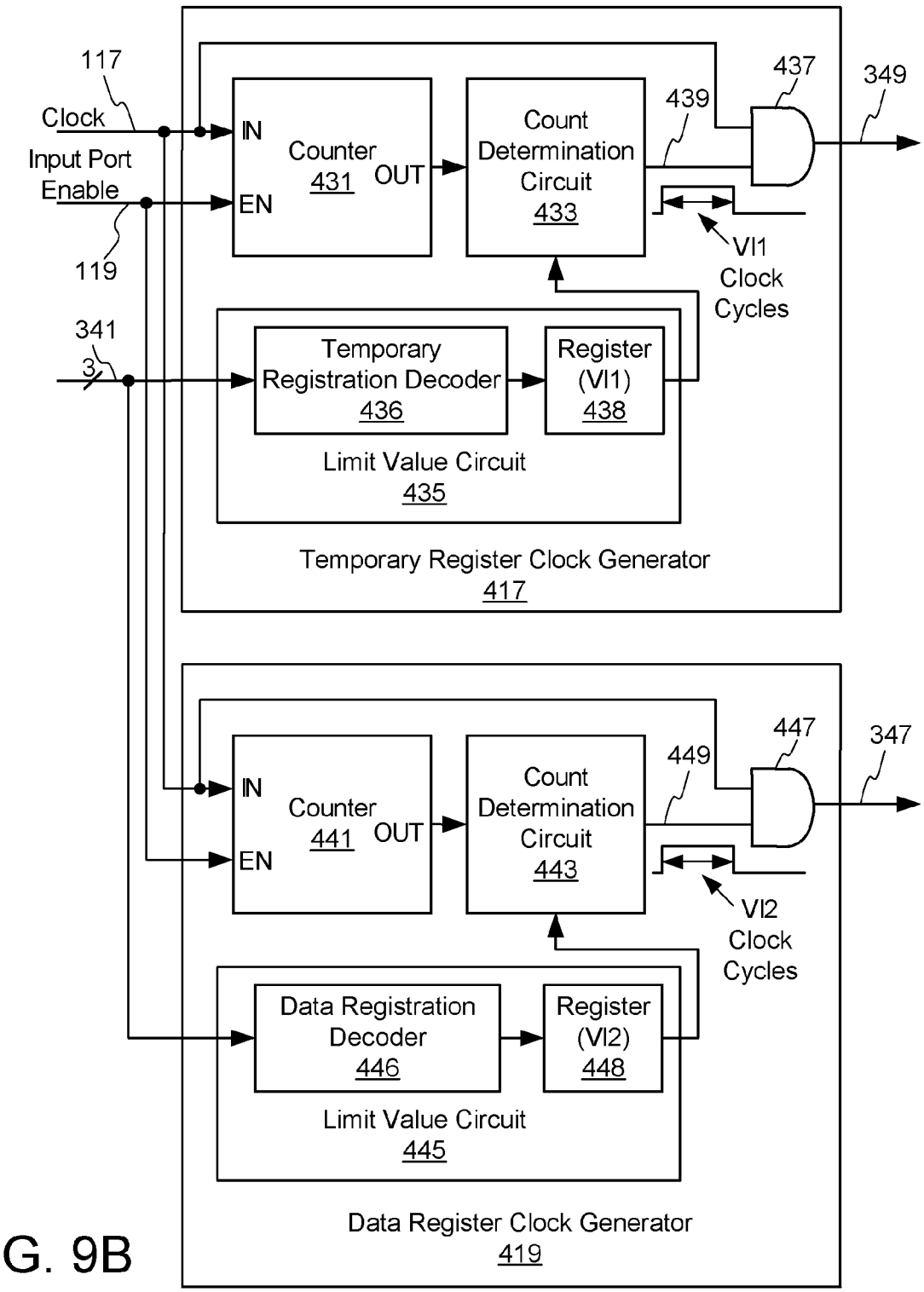
FIG. 9B is a block diagram illustrating a temporary register clock generator and a data register clock generator shown in FIG. 8.

FIG. 9B shows a more detailed circuit of the temporary register clock generator 417 and the data register clock generator 419 shown in FIG. 8. Referring to FIG. 9B, the temporary register clock generator 417 includes a counter 431, a count determination circuit 433, a limit value circuit 435 and an AND gate 437. The limit value circuit 435 includes a temporary registration decoder 436 and a register 437. The counter 431 is activated by the input port enable signal 119 fed to its enable input EN and thereafter, counts pulses of the clock signal 117 continuously that is fed to its count input IN. The three bit operation mode signals OPM1, OPM2 and OPM3 contained in the operation mode group signal 341 are fed to the decoder 436 of the limit value circuit 435. The decoder 436 decodes OPM1, OPM2 and OPM3 and its decoded value is registered in the register 438. The count determination circuit 433 determines whether the count by the counter 431 reaches a limit value Vl1 defined by OPM1, OPM2 and OPM3 held in the register 438. The count determination circuit 433 provides a count determination output signal 439 to the AND gate 437 that receives the clock signal 117. The count determination output signal 439 becomes "high" when the counter 431 starts counting and "low" when the count reaches the limit value Vl1. By gating in response to the signal 439, the AND gate 437 outputs Vl1 clocks that are to be contained in the temporary register clock signal 349. In this example, Vl1 defined by OPM1, OMP2 and OPM3 represents the total number of bits of the command and column and row addresses (see FIGS. 3A-3C).

Similarly, the data register clock generator 419 includes a counter 441, a count determination circuit 443, a limit value circuit 445 and an AND gate 447. The limit value circuit 445 includes a data registration decoder 446 and a register 448. The decoding function of the data registration decoder 446 is different from that of the temporary registration decoder 436. The counter 441 is activated by the input port enable signal 119 and thereafter, counts pulses of the clock signal 117 continuously. OPM1, OPM2 and OPM3 are decoded by the decoder 446 and its decoded value is registered in the register 448. The count determination circuit 443 determines whether the count by the counter 441 reaches a limit value Vl2 defined by OPM1, OPM2 and OPM3 held in the register 448. The count determination circuit 443 provides count determination output signal 449 to the AND gate 447. The count determination output signal 449 becomes "high" when the counter 441 starts counting and "low" when the count reaches the limit value Vl2. By gating in response to the signal 449, the AND gate 447 outputs Vl2 clocks that are to be contained in the data register clock signal 347. In this example, Vl2 defined by OPM1, OPM2 and OPM3 represents the total number of bits of the command, column and row addresses and data (see FIGS. 3A-3C).

Figure 10:
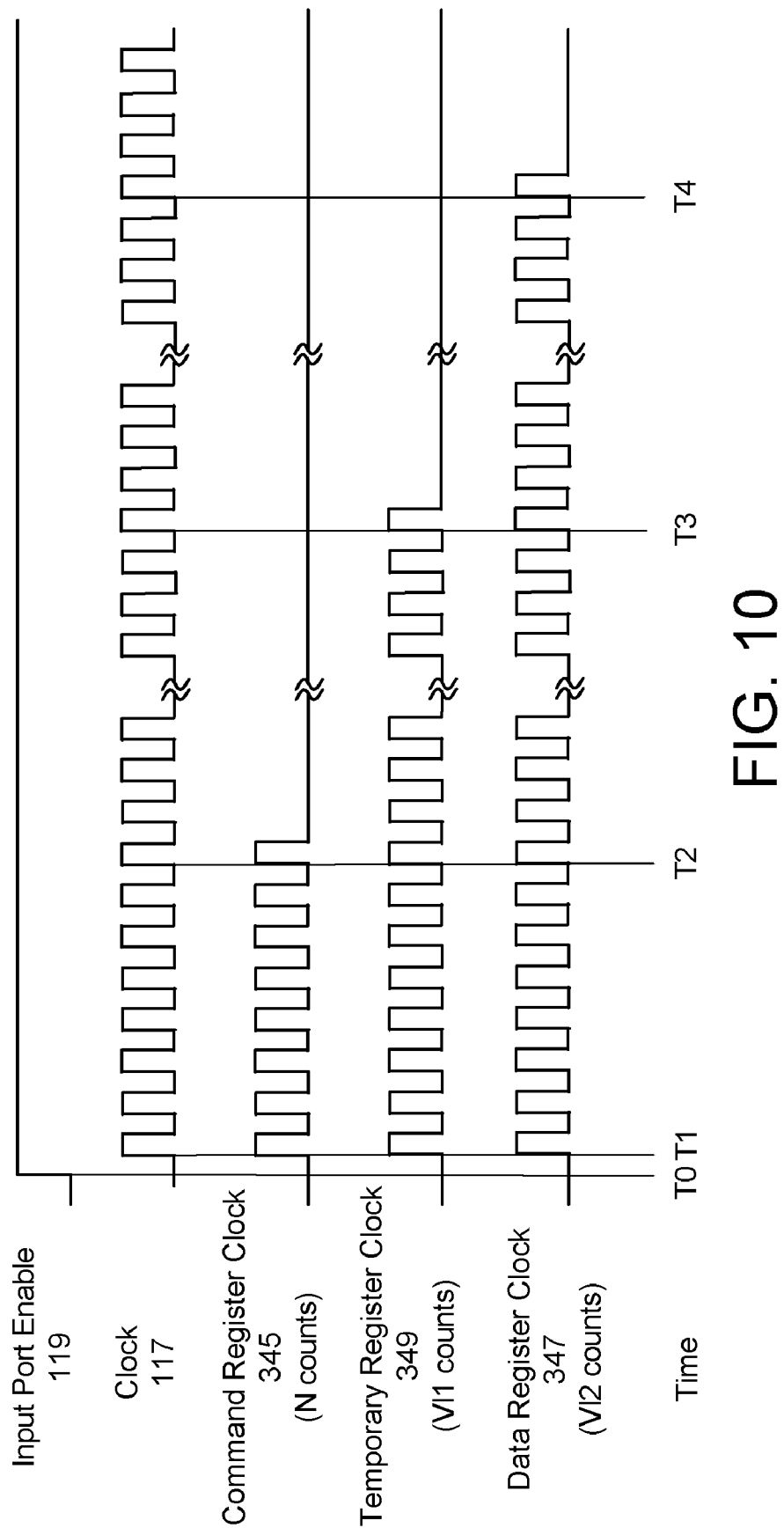
FIG. 10 is a relative timing sequence for the signals of the embodiment shown in FIGS. 5A, 5B and 5C.

FIG. 10 shows a relative timing sequence for the signals of the clock signal 117, the command register clock signal 345, the temporary register clock signal 349 and the data register clock signal 347 in the serial input processing apparatus shown in FIGS. 5A, 5B and 5C.

Referring to FIGS. 5, 9A, 9B and 10, in this example, by the input port enable signal 119 enabled at time T0, the command register clock generator 415, the temporary register clock generator 417 and the data register clock generator 419 are activated. The counters 421, 431 and 441 of these generators start the counting of the clock pulses. The generation of the command register clock signal 345, the temporary register clock signal 349 and the data register clock signal 347 commences at time T1. With N counts, the counter 421 ends counting (time T2). Thus, the generation of the command register clock signal 345 ceases. In response to the command register clock signal 345, the command register 317 stores the serial input bits therein. Thereafter, with Vl1 counts, the counter 431 ends counting (time T3). Thus, the generation of the temporary register clock signal 349 ceases. In response to the temporary register clock signal 349, the serial input bits are stored in the registers 321-329 of the temporary register block 320. Thereafter, with Vl2 counts, the counter 441 ends counting (time T4). Thus, the generation of the data register clock signal 347 ceases. In response to the data register clock signal 347, the data bits in the serial input are stored in the data register 319.

As such, the end points of the temporary register clock signal 349 and the data register clock signal 347 (T3 and T4) are determined by the command type. If the input command has only column addresses (two bytes), for example, three-byte data will be latched with 3×8 cycles=24 clocks. An example of the shortest command input is one byte without any following address or data input, such as read ID or write ID entry. In such an example, the already latched data in the temporary register block 320 is disregarded.

After latching bit data streams, the first-fifth temporary registers 321-329 of the temporary register block 320 are connected to the specified ones of the first and second column registers 377 and 379 of the column address register block 381 and the first, second and third row registers 389, 391 and 393 of the row address register block 395 for a row address or a column address, in accordance with the decoded or interpreted commands contained in the address switch control signal 399 from the command interpreter 343.

The operation mode <p:0> is used in the serial input processing apparatus as a control signal of path switches between the temporary registers and the specified address registers. The internal logic switches of the address switch circuit 371 are controlled by switching signals "SW" and "SW*". Along with the command interpretation, all commands are sorted out to produce operation modes <p:0> depending on the following bit stream information and the number of bytes following the command byte.

Table 1 shows command sorting for register switch control.

TABLE 1

| Command Definition in Serial Input | OPM3 | OPM2 | OPM1 |
|---|---|---|---|
| (i) Only Command | 0 | 0 | 0 |
| (ii) Command + 1 Byte Data | 0 | 0 | 1 |
| (iii) Command + Column Address | 0 | 1 | 0 |
| (iv) Command + Column Address + 2112 Byte Data | 0 | 1 | 1 |
| (v) Command + Column/Row Addresses + 2112 Byte Data | 1 | 0 | 0 |
| (vi) Command + Column/Row Addresses | 1 | 0 | 1 |
| (vii) Command + Row Address | 1 | 1 | 0 |

Table 1 shows one example of categorizing command types used in the serial input for the serially interconnected devices. The operation mode <p:0>" (p=2 in the serially interconnected devices) provides the information of the next address byte size and address type, and what address is following, so that continuous data bit streams can be decoded on the fly while input bit data is flowing into the data register and the temporary registers. In Table 1, (iv) Command+Column Address+2112 Byte Data is an example of the SI configuration shown in FIG. 3B. (v) Command+Column/Row Addresses+2112 Byte Data is an example of the SI configuration shown in FIG. 3A. For other command systems, the sorting of commands can be different from the one above, and can depend on the memory system configuration and functions it can execute.

The logic of the operation mode generation as shown in Table 1 is performed by the command sorter 455 shown in FIG. 7. After completing command decoding, all commands are sorted out in accordance with the type of addresses following the command byte. The generation of the temporary register clock signal 349 and the data register clock signal 347 are performed by the internal clock generator 335 shown in the FIG. 8. The counter 421 of the internal clock generator 335 needs to check the one byte unit from the first overlap rising point of the clock signal 117 and the IPE and provides the count output signal 423. Based on the signal pulses of the count output signal 423, another type based command clock generator 415, temporary register clock generator 417 and data clock generator 419 perform their functional operations of the internal clock generator 335.

In the example, the first and second bytes from the serial input to the SIP pin are allocated to the device number (DN) (one byte) and command (one byte). The first two bytes (corresponding to 16 clock cycles) are fixed and thus, no changes are applied thereto. From the third byte, the data register clock signal 347 and the temporary register clock signal 349 are enabled and toggled to capture the serial input bit streams, until the operation mode determines the end point of input data streams. The length of the input bit streams match with the expected result by the operation mode interpretation into the related block. The temporary five, three, two, one or 0 byte output takes control of the end point of the temporary register clock signal 349. The same control is performed for the generation of the data register clock signal 347 into the related block.

If the next address contains three bytes based on the operation mode interpretation, the temporary register clock signal 349 stops at the three-byte clock point. Along with the generation of the data register clock signal 347, the data latch and control are important factors.

As described above, the operation mode signal "<p:0>" is used in the serial input processing apparatus as a control signal for path switching between temporary and specified registers. The operation modes "OPM" contained in the operation mode group signal 341 is converted into the path switch control "SW" contained in the address switch control signal 399. Table 2 shows the operation mode and the decoded path switch control outputs.

TABLE 2

| Operation Mode "OPM" | | | Path Switch Control "SW" | | | | | |
|---|---|---|---|---|---|---|---|---|
| OPM3 | OPM2 | OPM1 | SW3 | SW3* | SW2 | SW2* | SW1 | SW1* |
| 0 | 0 | 0 | 0 | 1 | 0 | 1 | 0 | 1 |
| 0 | 0 | 1 | 0 | 1 | 0 | 1 | 0 | 1 |

TABLE 2-continued

| Operation Mode "OPM" | | | Path Switch Control "SW" | | | | | |
|---|---|---|---|---|---|---|---|---|
| OPM3 | OPM2 | OPM1 | SW3 | SW3* | SW2 | SW2* | SW1 | SW1* |
| 0 | 1 | 0 | 1 | 0 | 0 | 1 | 0 | 1 |
| 0 | 1 | 1 | 1 | 0 | 0 | 1 | 0 | 1 |
| 1 | 0 | 0 | 0 | 1 | 1 | 0 | 1 | 0 |
| 1 | 0 | 1 | 0 | 1 | 1 | 0 | 1 | 0 |
| 1 | 1 | 0 | 0 | 1 | 1 | 0 | 0 | 1 |
| 1 | 1 | 1 | 0 | 1 | 0 | 1 | 0 | 1 |

Table 2 is one example of categorizing command types used in the memory system where the multiple memory devices are serially interconnected. For other command systems, the sorted commands may be converted to different path switch control combinations depending upon the memory system.

Figure 11:
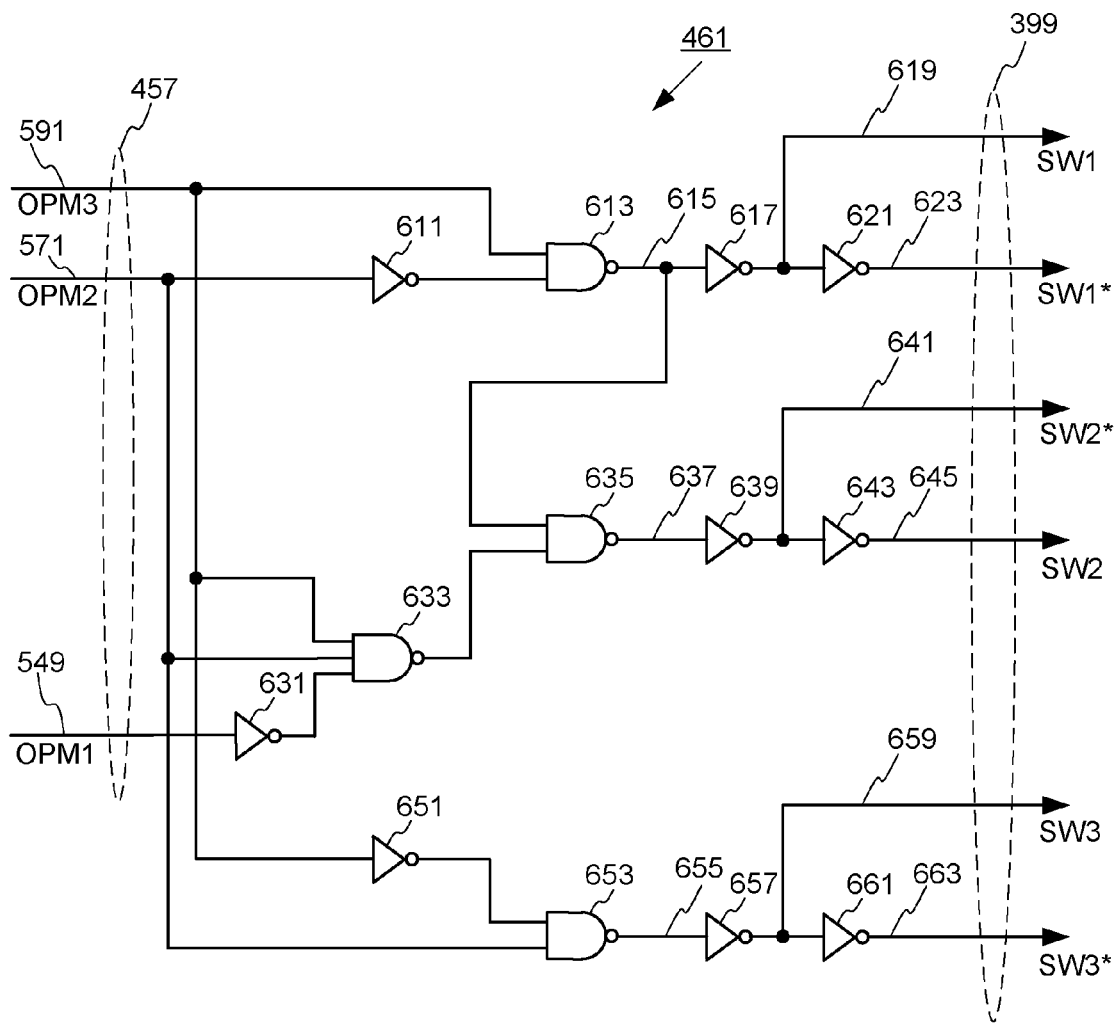
FIG. 11 is a block diagram illustrating an address switch controller shown in FIG. 6.

FIG. 11 shows the address switch controller 461 shown in FIG. 6. Referring to FIG. 11, the address switch controller 461 receives the signals "OPM3", "OPM2" and "OPM1" of the operation mode group signal 341. The second operation mode signal 571 ("OPM2") is inverted by an inverter 611 and its inverted output signal and the third operation mode signal 591 ("OPM3") are fed to a NAND gate 613. An output signal 615 of the NAND gate 613 is inverted by an inverter 617 and a first non-inverted switching signal 619 "SW1" is provided. The first non-inverted switching signal 619 is further inverted by an inverter 621 and a first inverted switching signal 623 "SW1*" is provided. The first operation mode signal 549 ("OPM1") is inverted by an inverter 631 and its inverted output signal, the second operation mode signal 571 and the third operation mode signal 591 are fed to a NAND gate 633. An output signal of the NAND gate 633 and the output signal 615 are fed to a NAND gate 635 and its output signal 637 is inverted by an inverter 639 that provides a second inverted switching signal 641 "SW2*". The second inverted switching signal 641 is further inverted by an inverter 643 and a second non-inverted switching signal 645 "SW2" is provided. The third operation mode signal 591 ("OPM3") is fed to an inverter 651 and its inverted output signal and the second operation mode signal 571 are fed to a NAND gate 653. An output signal 655 of the NAND gate 653 is inverted by an inverter 657 that provides a third non-inverted switching signal 659 "SW3". The third non-inverted switching signal 659 is further inverted by an inverter 661 and a third inverted switching signal 663 "SW3*" is provided. The first non-inverted switching signal 619, the first inverted switching signal 623, the second inverted switching signal 641, the second non-inverted switching signal 645, the third non-inverted switching signal 659 and the third inverted switching signal 663 are included in the address switch control signal 399. The NAND gate 635 and the inverter 639 form an AND circuit. Similarly, the NAND gate 653 and the inverter 657 form an AND circuit.

The address switch circuit 371 receives the first non-inverted switching signal 619 ("SW1"), the first inverted switching signal 623 ("SW1*"), the second inverted switching signal 641 ("SW2*"), the second non-inverted switching signal 645 ("SW1"), the third non-inverted switching signal 659 ("SW3"), and the third inverted switching signal 663 ("SW3*") included in the switching signal 399. The signals are provided by the address switch controller 461 shown in FIG. 11.

Figure 12:
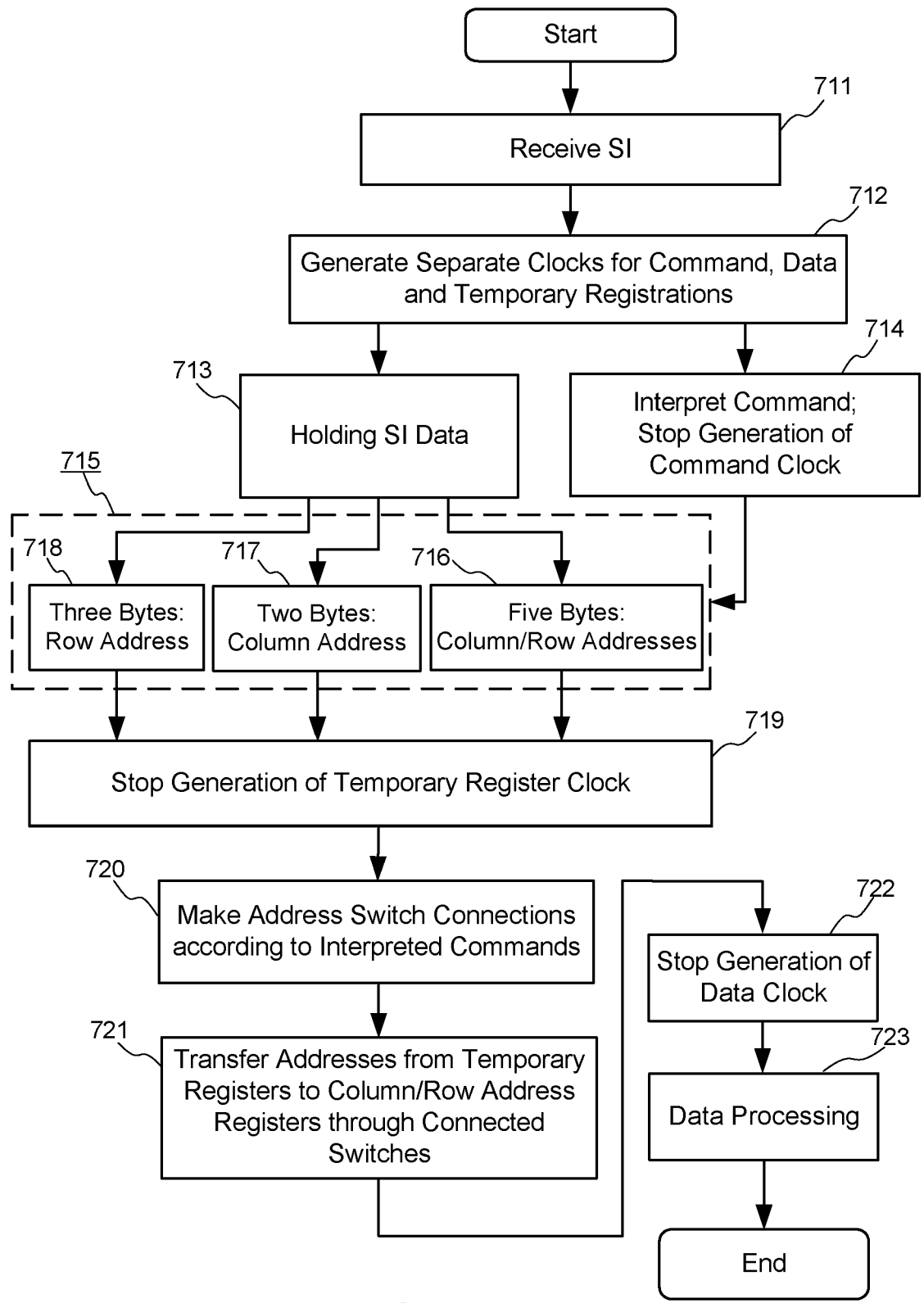
FIG. 12 is a flowchart illustrating a serial input control operation of the embodiment shown in FIGS. 5A, 5B and 5C.

FIG. 12 shows a flowchart of a data control operation of the serial input processing apparatus shown in FIGS. 5A, 5B and 5C. Referring to FIGS. 5A-5C and 6-12, after the SI signal is provided to the serial input processing apparatus, the data control operation starts. Upon the input port enable signal 119 becoming "high", the serial input data is continuously received from the SIP (step 711) and separate clocks for the command, data and temporary registrations are generated (step 712). In response to the temporary registration clocks, the serial input bits are held (step 713). During the bit holding, the command contained in the received SI signal is interpreted and the generation of the command registration clocks ceases (step 714). However, the generation of the temporary register clock and the data register clock continues and the SI registration continues and upon receipt of two, three or five bytes of addresses contained in the SI signal, the address is held (step 715). The information of the address byte number of two (i.e., column address), three (row address) or five (column and row addresses) is provided from the interpreted command (step 714). In accordance with the address byte information, the five byte address is held (step 716), the two byte address is held (step 717) or the three byte address is held (step 718) and the generation of the temporary registration clocks is ceased (step 719)). In step 717, two byte address is stored in the first-second temporary registers 321-323. In step 718, three byte address is stored in the first-third temporary registers 321-325. In step 716, five byte address is stored in the first-fifth temporary registers 321-329.

The address switch control signal 399 from the command interpreter 343 contains the operation commands interpreted at step 714. In accordance with the operation commands, the connections are made by the address switch circuit 371 in three different ways (step 720). Thereafter, the temporarily held addresses are transferred to the column address register block 381 and/or the row address register block 395 through the connected switches of the address switch circuit 371 (step 721).

In a case of two byte addresses, they are the column address (see FIG. 3B). The two byte addresses are held in the second and first temporary registers 323 and 321. The second and first temporary address output signals 363 and 361 are transferred to the second and first column registers 379 and 377, respectively, as shown in FIG. 5B (see an arrow (I) in the address switch circuit 371). (ii) In a case of three byte addresses, they are the row address (see FIG. 3C). The three byte addresses are held in the third, second and first temporary registers 325, 323 and 321. The third, second and first temporary address output signals 365, 363 and 361 are transferred to the third, second and first row registers 393, 391 and 389, respectively (see an arrow (II) in the switching address 371 in FIG. 5B). (iii) In a case of five byte addresses, the first two bytes represent the column address and the other three bytes represent the row address (see FIG. 3A). The first two byte address is held in the fifth and fourth temporary registers 329 and 327 and the other three byte address is held in the third, second and first temporary registers 325, 323 and 321. The fifth and fourth temporary address output signals 369 and 367 are transferred to the second and first column registers 379 and 377. The third, second and first temporary address output signals 365, 363 and 361 are transferred to the third, second and first row registers 393, 391 and 389, respectively. (See an arrow (III) in the switching address 371 in FIG. 5B).

In response to the column address latch signal 382, the first and second column registers 377 and 379 latch the provided temporary register address therein. Similarly, in response to the row address latch signal 384, the first-third row registers 389-393 latch the provided temporary register address therein.

Upon completion of the transfer of the temporary register address, the generation of data clocks is ceased (step 722). In response to the column address read signal 386, the registered column address in the first and second column registers 377 and 379 is read and provided to the controller/data processor 370. Similarly, in response to the row address read signal 388, the registered row address in the first-third row registers 389-393 is read and provided to the controller/data processor 370. The controller/data processor 370 performs data processing with access to the memory 372 (step 23). The processed data is outputted as the serial output signal from the serial output port (SOP) to the SIP of the next device. The registers capture all bit data without loss during command interpretation by the command interpreter 343.

In the embodiment, as described above, simultaneous data capturing and interpretation of commands are performed, with the results that the chance of losing data with the short cycle operation can be reduced. Using the temporary register block 320 avoids any requirement for a time interval to wait and interpret command data. While the command data is being decoded in the command register 317, the bit streams from the SIP pin are stored temporarily into the temporary register block 320 until a new command is issued. Depending on the result of the command interpreter 343, the address switch circuit 371 makes one or more connections from the temporary register block 320 to the column address register block 381 and the row address register block 395. In this way, high speed operation without a time interval between command interpretation and the continuous data capture can be achieved. This independent path control between command decoding and next serial data bit stream capturing using the temporary register block 320 ensures the high speed operation.

FIGS. 13A, 13B and 13C depict other configurations of the serial input signal 115 provided to the first device 113-1 shown in FIG. 1. These are examples of the column and row address bytes being allocated to "fixed" positions in the bit stream. While the grouped bit stream includes a device number (DN) (one byte), it is not shown here. The configuration shown in FIG. 13A is the same as the one shown in FIG. 3A: i.e., command+column and row addresses+2112 byte data. The configuration shown in FIG. 13B is similar to the one shown in FIG. 3B: i.e., command+column address+2112 byte data. But, because of no row address, three bytes between the column address and the data are dummy row address bytes "dummy". The configuration shown in FIG. 13C is similar to one shown in FIG. 3C: i.e., command+row address+2112 byte data. But, because of no column address, two bytes before the row address are dummy column address bytes. As such, after the command, two bytes and three bytes are fixedly allocated to column and row addresses. The other bits are flexibly allocated for other bit information.

Figure 14A:
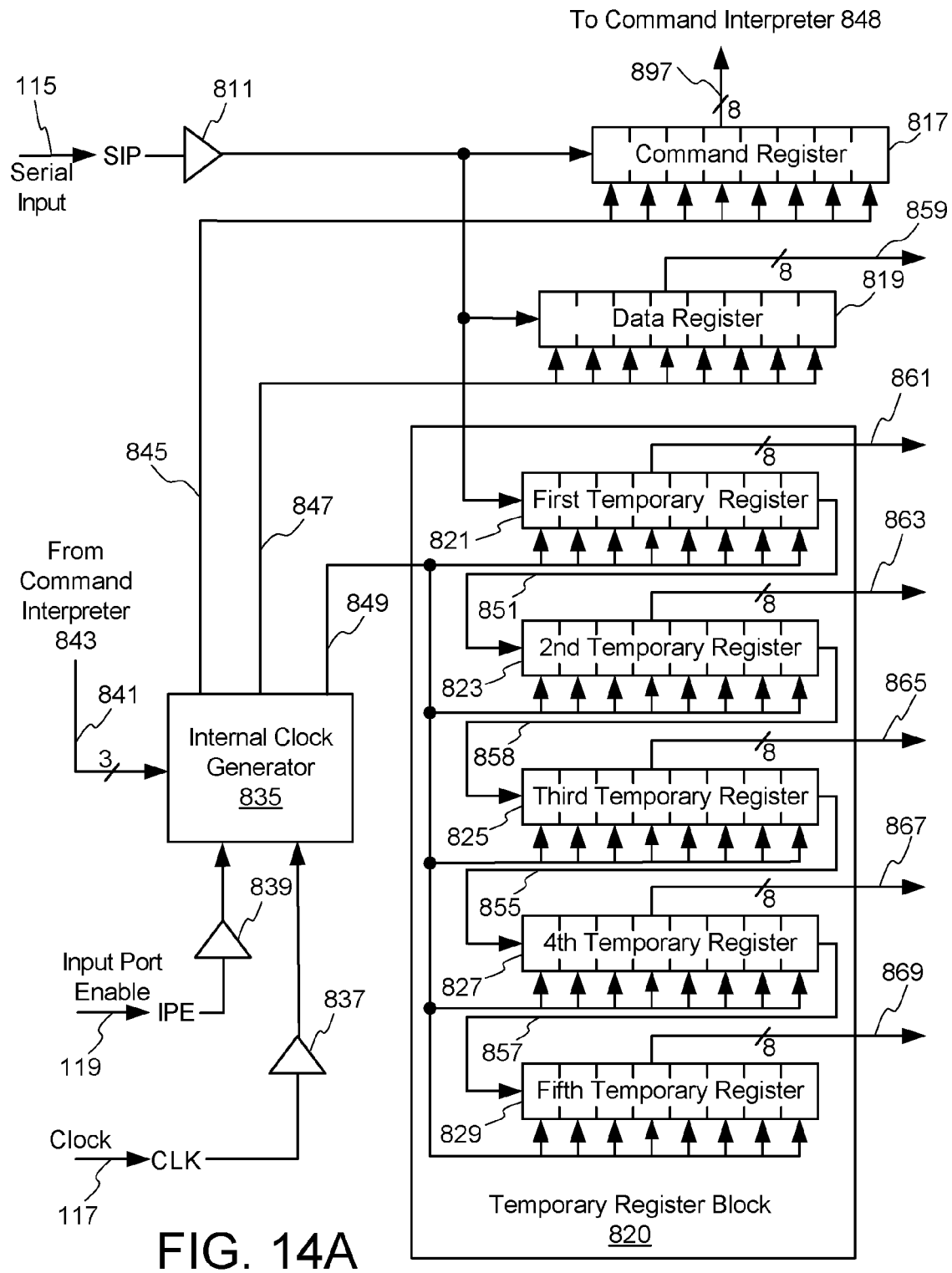
FIGS. 14A, 14B and 14C illustrate one of the devices shown in FIG. 1 in accordance with another embodiment of the present invention.
Figure 14B:
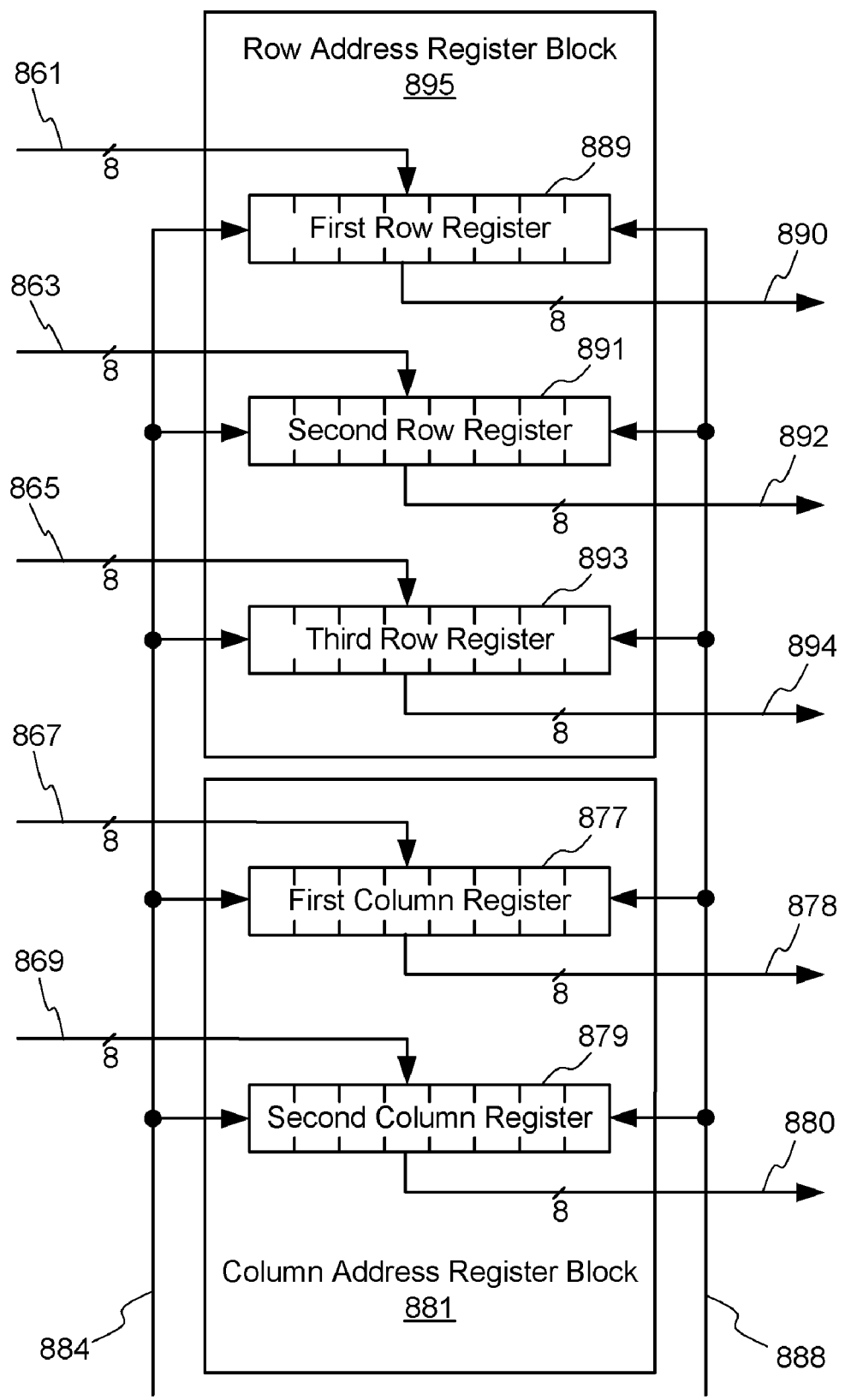
Figure 14C:
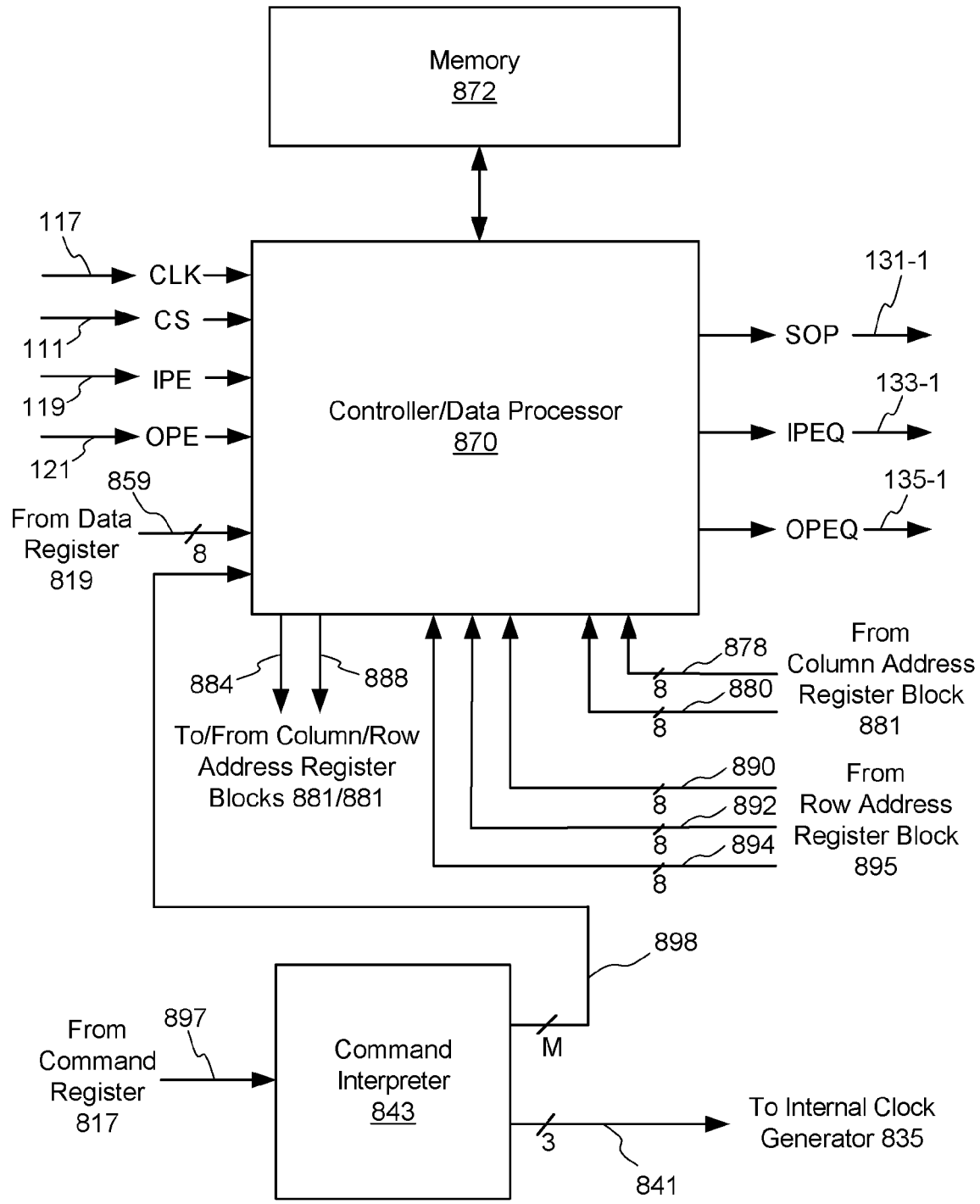

FIGS. 14A, 14B and 14C show another embodiment of the present invention to which the serial input shown in FIGS. 13A-13C is applied. The difference from the one shown in FIGS. 5A, 5B and 5C is that there is neither an address switch circuit nor an address switch control signal. These aforementioned components are not required because the row and column address bytes would be mapped to the same positions in any command bit stream. In the previous embodiment, the eight bit data temporarily held in the temporary registers are transferred to the corresponding address registers.

Referring to FIGS. 14A-14C, the serial input signal 115 containing commands, addresses and data is fed to a buffer 811 through its serial input port (SIP). The serial input signal 115 is fed to a command register 817, a data register 819 and a temporary register block 820 including first-fifth temporary registers 821, 823, 825, 827 and 829. Each of the command register 817, the data register 819 and the first temporary register 821 receives the commands, addresses and data contained in the serial input signal 115 sequentially.

An internal clock generator 835 receives the clock signal 117 and the input port enable signal 119 through a buffer 837 and a buffer 839, respectively. A clock generation control signal 841 is fed from a command interpreter 843 to the internal clock generator 835 that provides a command register clock signal 845, a data register clock signal 847 and a temporary register clock signal 849 to the command register 817, the data register 819 and the first-fifth temporary registers 821-829, respectively, of the temporary register block 820.

In response to the data on the SIP, the command register 817 provides a registered command output signal 897 to the command interpreter 843. The command interpreter 843 provides a decoded instruction signal 898 and an address switch control signal 899 to a controller/data processor 870 and an address switch circuit 871, respectively. In response to the chip select signal 111, the input port enable signal 119 and the output port enable signal 121, the controller/data processor 870 controls the device and provides the input port enable output signal 133-1 and the output port enable output signal 135-1, respectively. Also, in response to the registered data output signal 859 and the decoded instruction signal 898, the controller/data processor 870 performs the function of data access (write and/or read) to a memory 872. In response to the chip select signal 111 and the output port enable signal 121, the outputted data is outputted as the serial output signal 131-1.

A first temporary address signal 851 serially outputted from the first temporary register 821 is fed to the second temporary register 823, the second temporary address signal 853 from which is fed to the third temporary register 825. A third temporary address signal 855 from the third temporary register 825 is fed to the fourth temporary register 827, the fourth temporary address signal 857 from which is fed to the fifth temporary register 829.

A first temporary address output signal 861 of eight bits from the first temporary register 821, a second temporary address output signal 863 of eight bits from the second temporary register 823, a third temporary address output signal 865 of eight bits from the third temporary register 825, a fourth temporary address output signal 867 of eight bits from the fourth temporary register 827 and a fifth temporary address output signal 869 of eight bits from the fifth temporary register 829 are fed to first, second and third row registers 889, 891 and 893 of a row address register block 895 and first and second column registers 877 and 879 of a column address register block 881.

In response to a latch signal 884, the eight bit data of each of the first-fifth temporary address output signals 861-869 is latched in the corresponding registers of the row and column address register blocks 895 and 881. In response to an address read signal 888, the eight bit data of each of the registers of the row and column address register blocks 895 and 881 is read and provided to the controller/data processor 870. The latch signal 884 and the address read signal 888 are provided by the controller/data processor 870.

Figure 15:
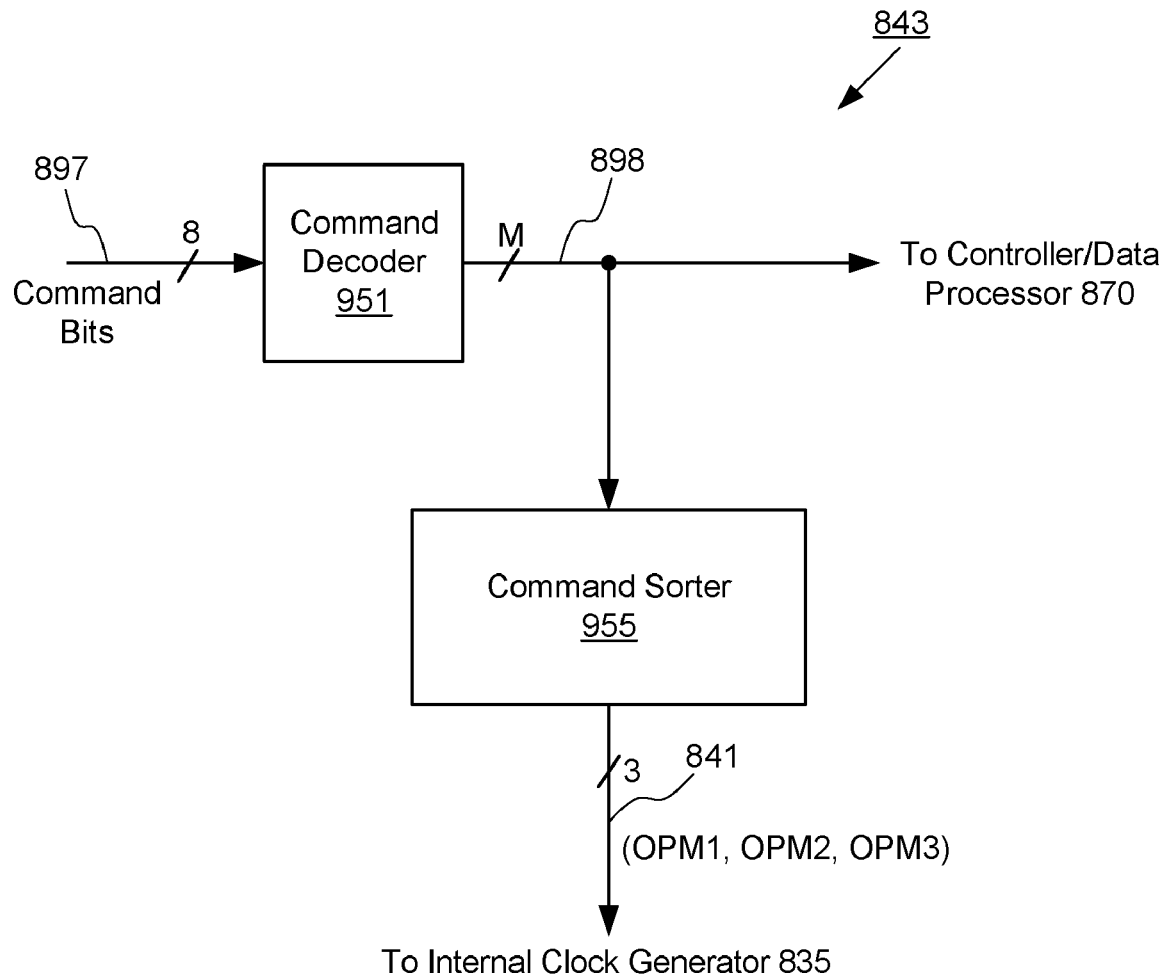
FIG. 15 is a block diagram illustrating a command interpreter shown in FIG. 14C.

FIG. 15 shows a more detailed circuit of the command interpreter 843 shown in FIG. 14C. The command interpreter 843 is a combined logic circuit for controlling the local and internal clock generation in accordance with the input command types. Referring to FIG. 15, the registered command output signal 897 having K command bits (e.g., 8 bits) is fed to a command decoder 951 which in turn provides the decoded instruction signal 898 having M bits that are provided as internal instructions. From the command decoder 951, based on "command bits" input of the registered command output signal 897, internal instructions are generated. M bits denote the number of instructions to be executed by the device. The decoded instruction signal 898 is fed to a command sorter 955, whereby, in accordance with the pre-defined command categories, an operation mode group signal containing operation modes OPM1, OPM2 and OPM3 is decoded.

In the example shown in FIGS. 14A-14C and 15, the operation mode group signal from the command sorter 955 is the clock generation control signal 841 that is provided to the internal clock generator 835 for clock generation. In response to the temporary register clock signal 849 provided by the internal clock generator 835, the registers 821-829 of the temporary register block 820 store column and row addresses. The sequence of addresses is established by the input commands.

Figure 16:
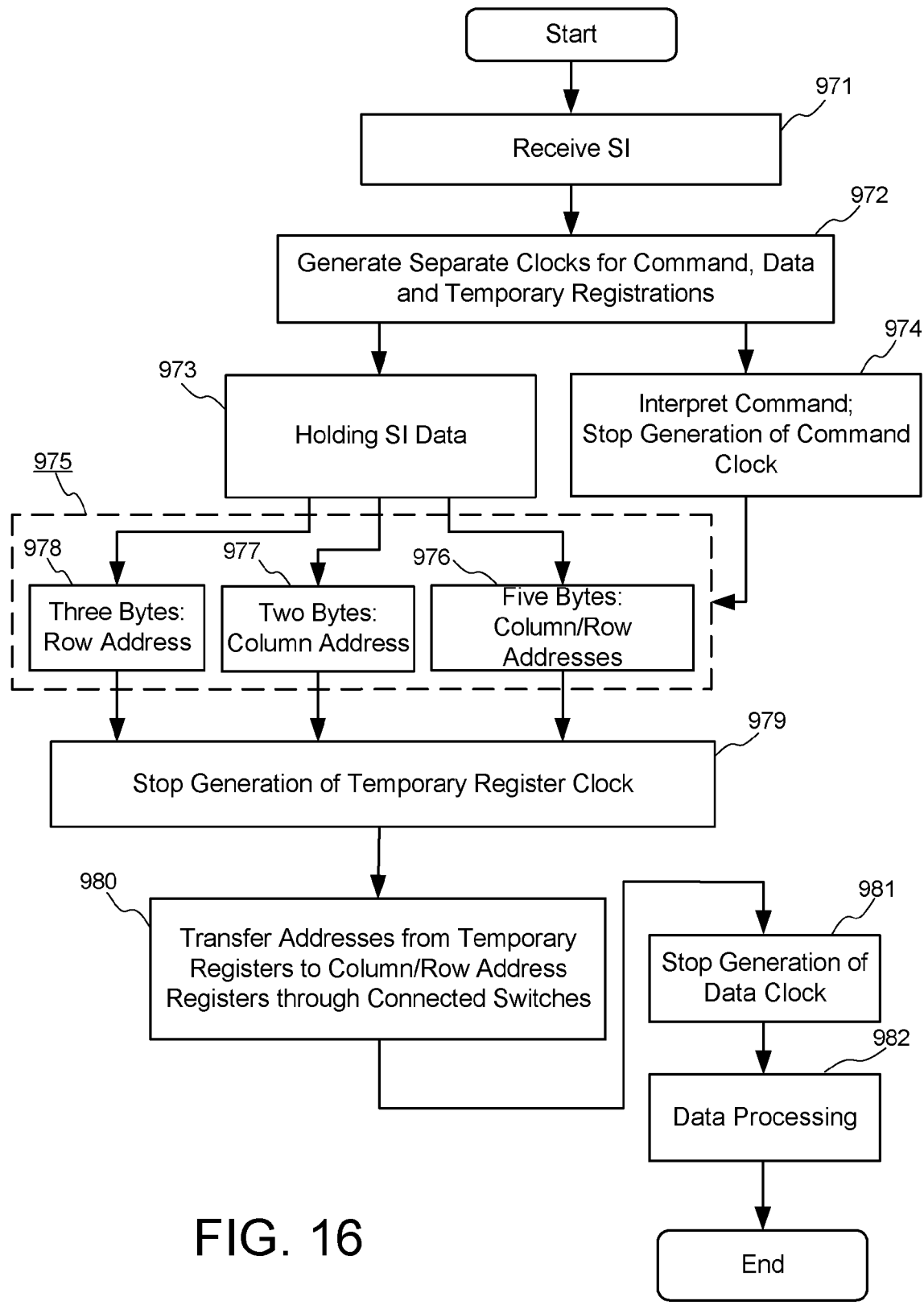
FIG. 16 is a flowchart illustrating a serial input control operation of the other embodiment shown in FIGS. 14A, 14B and 14C.

FIG. 16 shows a flowchart of a data control operation of the serial input processing apparatus shown in FIGS. 14A, 14B and 14C. Referring to FIGS. 14A-14C and 15-16, after the SI signal is provided to the serial input processing apparatus, the data control operation starts. Upon the input port enable signal 119 becoming "high", the serial input data is continuously received from the SIP (step 971) and separate clocks for the command, data and temporary registrations are generated (step 972). In response to the temporary registration clocks, the serial input bits are held (step 973). During the bit holding, the command contained in the received SI signal is interpreted and the generation of the command registration clocks ceases (step 974). However, the generation of the temporary register clock and the data register clock continues and the SI registration continues and upon receipt of two, three or five bytes of addresses contained in the SI signal, the address is held in the five registers 829-821 of the temporary register block 820 (step 975).

In a case of five bytes of address (i.e., the column and row addresses as shown in FIG. 13A), the five byte addresses are stored in the fifth-first temporary registers 829-821 (step 976). In a case of two bytes of address (i.e., the column address as shown in FIG. 13B), the two byte addresses are stored in the fifth and fourth temporary registers 829 and 827 (step 977). In a case of three bytes of address (i.e., the row address as shown in FIG. 13C), the three byte addresses are stored in the fifth-third temporary registers 829-825 (step 978). Then, the generation of the temporary registration clock is ceased (step 979). As such, the temporarily held addresses are transferred to the column address register block 881 and/ or the row address register block 895 (step 980).

Upon completion of the transfer of the temporary register address, the generation of data clocks is ceased (step 981). In response to the read signal 888, the registered column address in the first and second column registers 877 and 879 is read and provided to the controller/data processor 870. Similarly, in response to the read signal 888, the registered row address in the first-third row registers 889-893 is read and provided to the controller/data processor 870. The controller/data processor 870 performs data processing with access to the memory 872 (step 978). The processed data is outputted as the serial output signal from the SOP to the SIP of the next device. The registers capture all bit data without loss during command interpretation by the command interpreter 843. The processed data is outputted as the serial output signal from the SOP to the SIP of the next device. The registers capture all bit data without loss during command interpretation by the command interpreter 843. The controller/data processor 870 disregards the "dummy" address and column and row address bytes.

Figure 17:
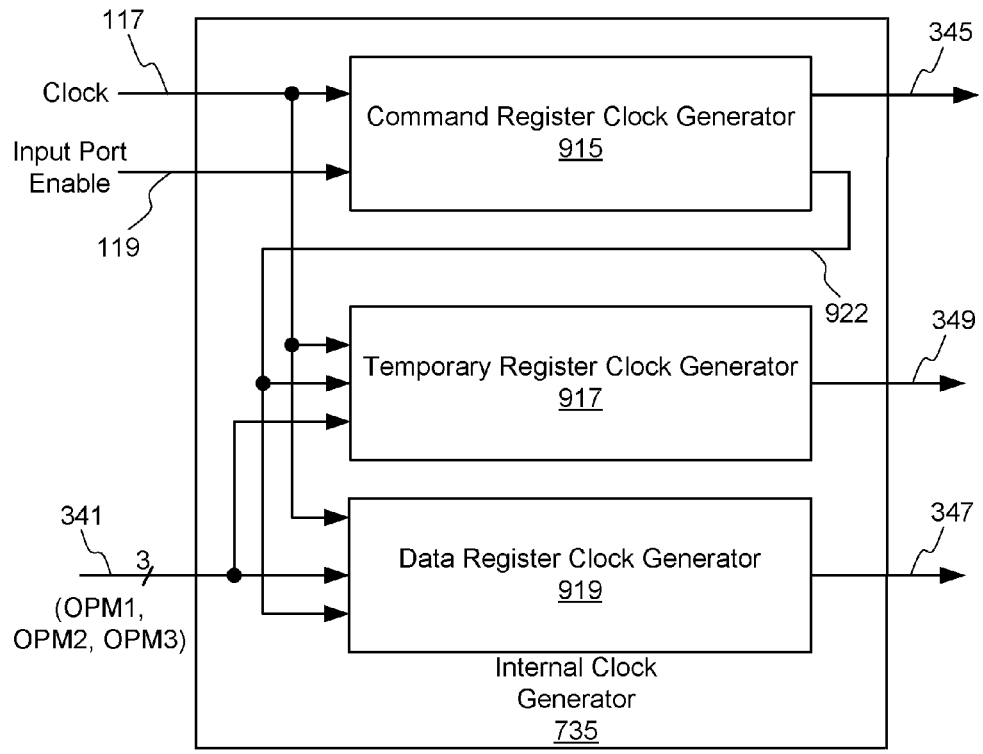
FIG. 17 is a block diagram illustrating another example of the internal clock generator shown in FIG. 5A.
Figure 18A:
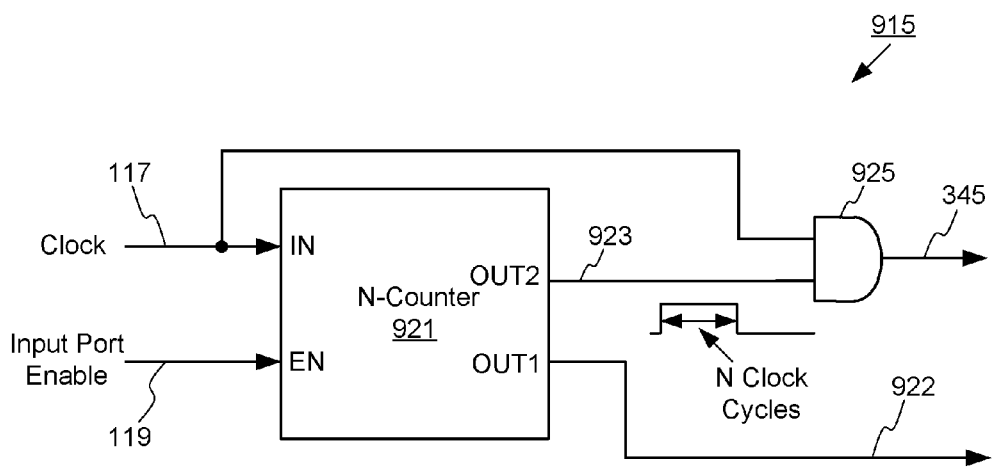
FIG. 18A is a block diagram illustrating a command register clock generator included in the internal clock generator shown in FIG. 17.

FIG. 17 shows another example of the internal clock generator shown in FIG. 5A. Referring to FIG. 17, an internal clock generator 735 includes a command registrar clock generator 915, a temporary register clock generator 917 and a data register clock generator 919. As shown in FIG. 18A, the command register clock generator 915 includes an N-counter 921 having a clock input IN for receiving the clock signal 117 and an enable input EN for receiving the input port enable signal 119. The counter 921 has count outputs OUT1 and OUT2 for providing its count output signal 922 and 923, respectively. The output signal 922 is a delayed enable signal for enabling the temporary register clock generator 917 and the data register clock generator 919. The output signal 923 is fed to an AND gate 925 which in turn provides the command register clock signal 345. The clock signal 117 is also fed to the AND gate 925. The counter 921 is activated by the input port enable signal 119 and counts pulses of the clock signal 117. When the count reaches N (e.g., eight), the counting ends. The count output signal 923 is "high" during counting N (i.e., eight clock cycles corresponding to one byte). Thus, by gating in response to the count output signal 923, the AND gate 925 outputs N (i.e., eight) clocks that are to be contained in the command register clock signal 345.

Figure 18B:
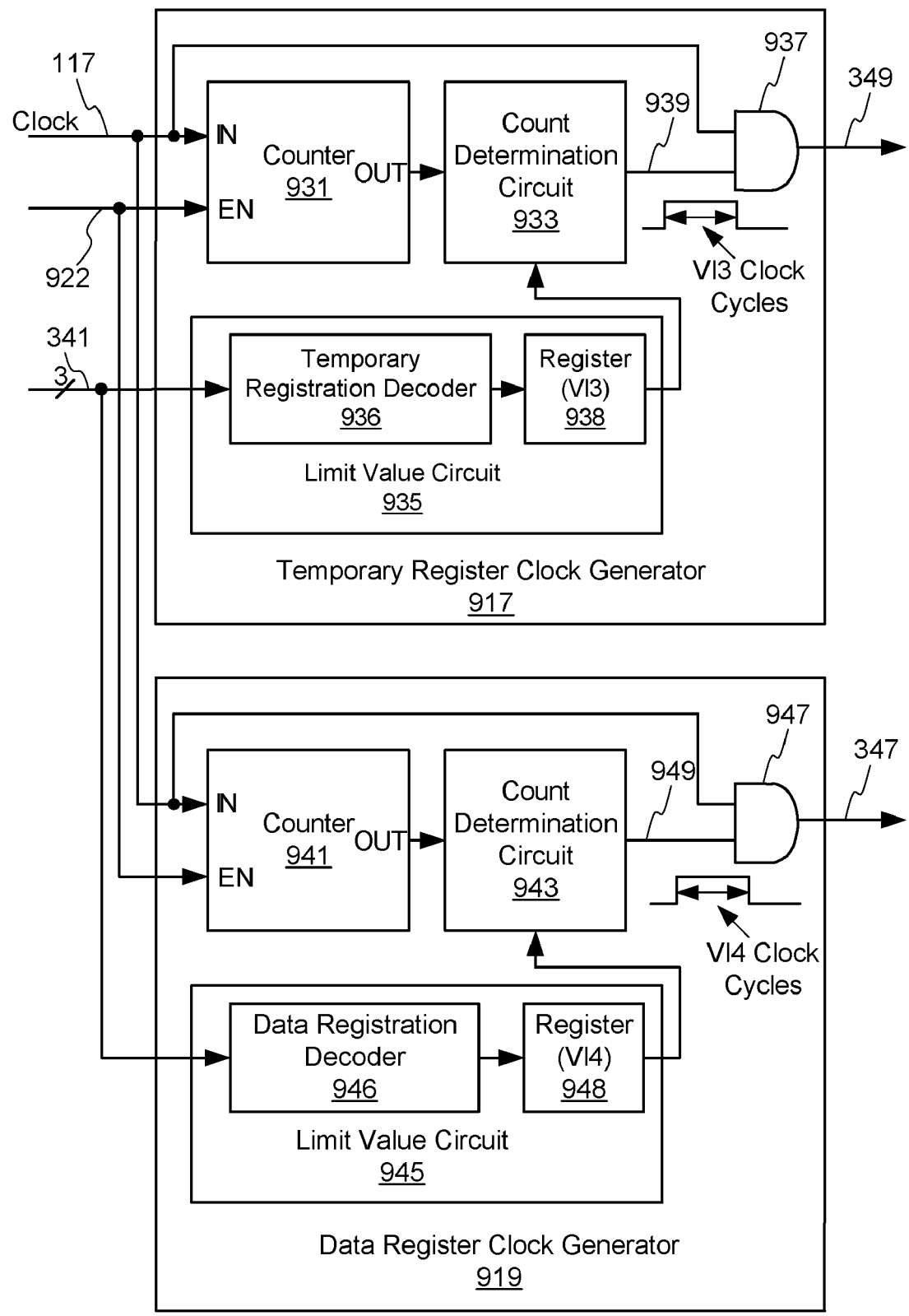
FIG. 18B is a block diagram illustrating a temporary register clock generator and a data register clock generator shown in FIG. 17.

FIG. 18B shows a more detailed circuit of the temporary register clock generator 917 and the data register clock generator 919 shown in FIG. 17. Referring to FIG. 18B, the temporary register clock generator 917 includes a counter 931, a count determination circuit 933, a limit value circuit 935 and an AND gate 937. The limit value circuit 935 includes a temporary registration decoder 936 and a register 938.

Similarly, the data register clock generator 919 includes a counter 941, a count determination circuit 943, a limit value circuit 945 and an AND gate 947. The limit value circuit 945 includes a data registration decoder 946 and a register 948. The decoding function of the data registration decoder 946 is different from that of the temporary registration decoder 936.

The counters 931 and 941 are activated by the delayed enable signal 922 fed to the enable inputs EN thereof and thereafter, they count pulses of the clock signal 117 continuously. The three bit operation mode signals OPM1, OPM2 and OPM3 contained in the operation mode group signal 341 are fed to the decoders 936 and 946. The decoded values Vl3 and Vl4 of OPM1, OPM2 and OPM3 are provided to the registers 938 and 948 for registration. The count determination circuits 933 and 943 determine whether the counts reach the limit values Vl3 and Vl4 and provide count determination output signals 939 and 949, respectively. In response to the count determination output signals 939 and 949, the AND gates 937 and 947 output the clock signals 349 and 347 containing Vl3 clock pluses and Vl4 clock pulses, respectively.

Figure 19:
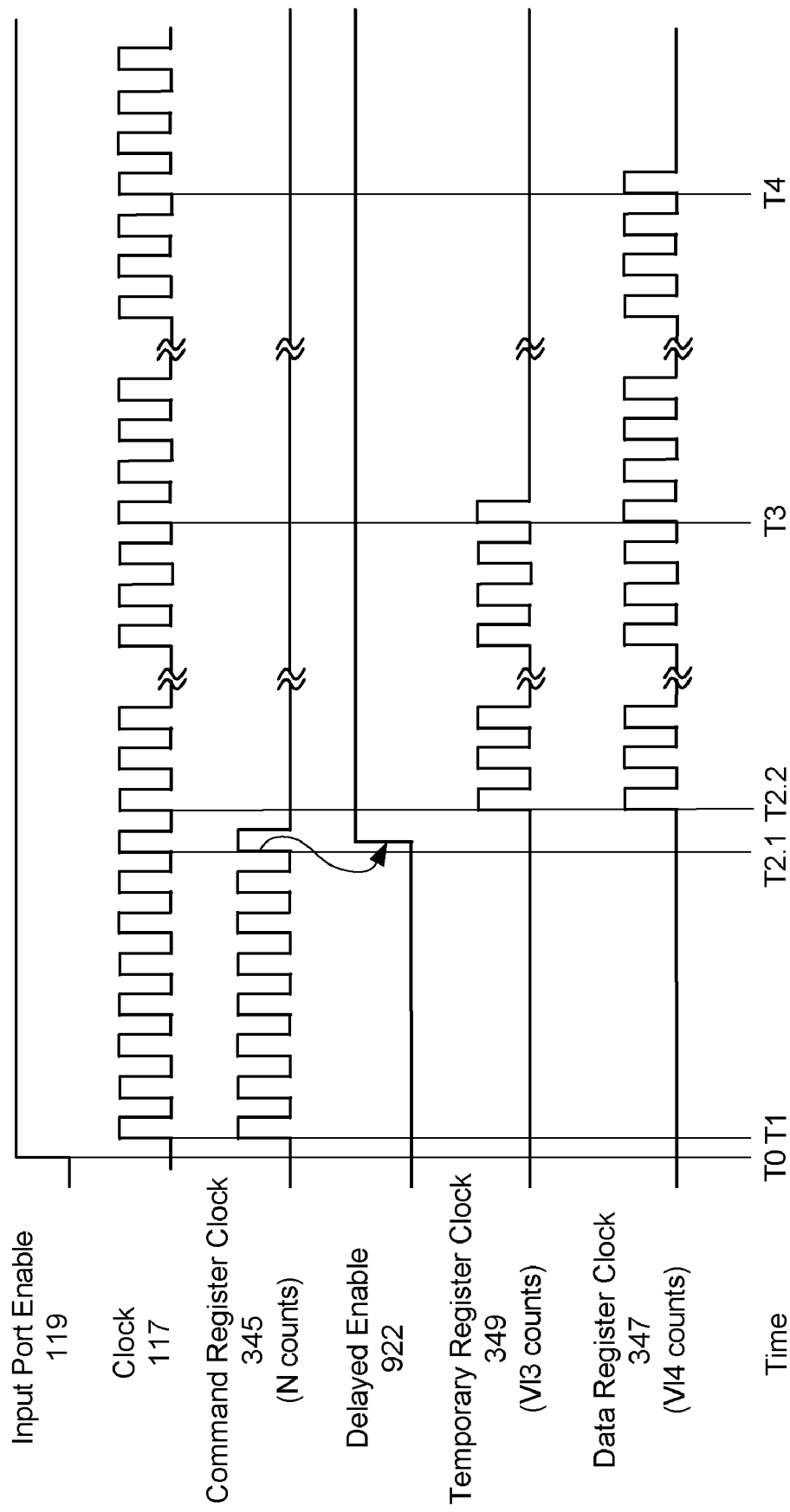
FIG. 19 is a relative timing sequence for the signals of the internal clock generator shown in FIG. 17.

FIG. 19 shows a relative timing sequence for the clock signals provided by the internal clock generator 735 shown in FIG. 17. Referring to FIGS. 17-19, when the input port enable signal 119 is enabled, the command register clock generator 915 is activated (time T0) The counter 921 starts counting of the clock pulses and the generation of the command register clock signal 345 commences at time T1. When the count reaches N, the counter 921 ends counting (time T2.1) and the delayed enable signal 22 is provided. In response to the delayed enable signal 922, the counters 931 and 941 are enabled to count the clock pulses of the clock signal 117. At the first clock pulse, the counters 931 and 941 commence counting (time T2.2). With Vl3 count, the counter 931 ends counting (time T3). Thus, the clock pulse generation of the temporary register clock signal 349 ceases. Similarly, with Vl4 count, the counter 441 ends counting (time T4). The clock pulse generation of the data register clock signal 347 ceases. In this example, the counters 931 and 941 do not operate until the N-counter 921 completes counting and thus, power consumption is reduced.

In accordance with the embodiment that includes the temporary registers and the separate clock generation for each register, the serial Flash memory can be operated at high speed. In particular, no time interval between command and following address bytes as in the normal serial Flash memory is required.

The embodiments according to the present invention provides how to capture serial data without loss of a single bit while command interpretation is being executed in the command interpreter 343 at a high speed. Multiple clocks are used for latching individual bytes according to the serial bit sequence defined in the operations, and temporary registers are used for storing bit streams temporarily before transferring byte information to the assigned registers, such as address registers. All bit streams received at the input port, which is the SI, are latched at the rising edges of clocks. In the case of 1 GHz operation as a one example, a 1 ns cycle time does not provide enough timing margin between the command bit stream interpretation and the next bit data stream, therefore additional registers to store incoming bit data during command interpretation should be considered. The embodiments provides means to control temporary registers and generate the multiple clocks to latch bit data streams, instead of using a single common clock. The embodiments can be used in high speed operation with clock frequencies over 1 GHz (1 ns cycle time). There is no interval time required between serial command bits and the next bit streams for decoding a command.

In the above-described embodiments, the operation has been described based on the active "high" signals for the purpose of simplicity. The circuits may be designed to perform the operation based on the "low" active signals, in accordance with a design preference. The command register clock signal 345 may have two bytes or more bytes in accordance with operation code assignment. Timing control can be changed from the sequential and multiple clocks enabled by command type to the single clock with additional control signals to activate the selected serial registers. The sequence of issuing multiple clocks can be varied in accordance with the specification of timing, arrangement of addresses, and the length of addresses. As mentioned before, it can apply the serial Flash memory or the product with serial input bit stream control.

In the embodiments described above, the device elements and circuits are connected to each other as shown in the figures, for the sake of simplicity. In practical applications of the present invention to apparatus, devices, elements, circuits, etc., may be connected directly to each other. As well, devices, elements, circuits, etc., may be connected indirectly to each other through other devices, elements, circuits, etc., necessary for operation of the apparatus. Thus, in actual configuration, the circuit elements and devices are directly or indirectly coupled with each other.

The embodiments have been described in conjunction with MISL. However, the present invention is not limited to it. The present invention is applicable to any apparatus and method for capturing or processing serial input data.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for processing a serial input (SI) including command, address and data in accordance with a pre-defined sequence and grouped as bit streams representing the command address and data, the method comprising:

receiving the SI;

holding the bit streams of the received SI by temporarily storing the bit stream representing the address in the received SI;

interpreting the command of the received SI by storing the command of the received SI, and decoding the stored command to determine an operation control mode of the command, the command being interpreted independently of holding the bit streams and during the step of holding being conducted;

accessing a memory in response to the interpreted command and based on the temporarily stored address;

receiving an input enable (IPE) to enable receiving of the command of the SI;

producing operation clocks locally in response to an input clock that relates to the bit stream by producing a first clock in response to the input clock and the input enable, the first clock being used for interpreting the command;

producing a second clock in response to the input clock and the operation control mode, independently of the first clock, the second clock being used for holding the bit streams;

and, producing a third clock in response to the input clock and the operation control mode, the third clock being used for holding the bit streams relating to the data;

ceasing the production of the first clock;

ceasing the production of the second clock after the ceasing production of the first clock, in accordance with the determined operation control mode;

and ceasing the production of the third clock after the ceasing of production of the second clock, in accordance with the determined operation control mode.

2. The method of claim, wherein the step of accessing comprises:

capturing the data of the received SI;

and the step of holding comprises:

transferring the temporarily stored address for accessing the memory based on the captured data.

3. The method of claim 2, wherein the step of transferring comprises establishing a path of the temporarily stored address in response to the operation control mode, so as to transfer the temporarily stored address therethrough.

4. The method of claim 3, further comprising providing transfer path information according to the operation control mode, the transfer path information being used for establishing a path of the temporarily stored address.

5. The method of claim 2, wherein the step of transferring comprises transferring the temporarily stored address through a pre-defined path.

6. The method of claim 1, wherein the step of producing a second clock comprises:
    producing the second clock in response to the received input enable i~; and the step of producing a third clock comprises:
    producing the third clock in response to the received input enable.

7. The method of claim 1, wherein the step of producing a second clock comprises:
    producing the second clock upon completion of ceasing the production of the first clock; and the step of producing a third clock comprises:
    producing the third clock upon completion of ceasing the production of the first clock.

* * * * *

UNITED STATES PATENT AND TRADEMARK OFFICE
CERTIFICATE OF CORRECTION

PATENT NO. : 7,818,464 B2
APPLICATION NO. : 11/567551
DATED : October 19, 2010
INVENTOR(S) : Hong Beom Pyeon et al.

It is certified that error appears in the above-identified patent and that said Letters Patent is hereby corrected as shown below:

Title Page, Item (54) and in the specifications, column 1, line 1, Title, delete "APPARATUS AND METHOD FOR CAPUTRING SERIAL INPUT DATA" and insert therefor --METHOD FOR HIGH SPEED CAPTURING AND PROCESSING OF SERIAL INPUT DATA--;

Title Page 2, column 1, Item (56) under U.S. Patent Documents, line 3, insert
--5472566 A 12/1995, Rao--;

In the Claims:

Column 22, line 51, claim 2, delete "claim" and insert therefor --claim 1--;

Column 23, line 4, claim 6, delete "i ~".

Signed and Sealed this
Fourth Day of June, 2013

Teresa Stanek Rea
*Acting Director of the United States Patent and Trademark Office*